(12) United States Patent
Wakano et al.

(10) Patent No.: US 11,404,595 B2
(45) Date of Patent: Aug. 2, 2022

(54) AVALANCHE PHOTODIODE SENSOR, AND ELECTRONIC DEVICE

(71) Applicant: SONY SEMICONDUCTOR SOLUTIONS CORPORATION, Kanagawa (JP)

(72) Inventors: Toshifumi Wakano, Kanagawa (JP); Yusuke Otake, Kanagawa (JP)

(73) Assignee: Sony Semiconductor Solutions Corporation, Kanagawa (JP)

(*) Notice: Subject to any disclaimer, the term of this patent is extended or adjusted under 35 U.S.C. 154(b) by 0 days.

(21) Appl. No.: 16/636,866

(22) PCT Filed: Sep. 21, 2018

(86) PCT No.: PCT/JP2018/035165
§ 371 (c)(1),
(2) Date: Feb. 5, 2020

(87) PCT Pub. No.: WO2019/111493
PCT Pub. Date: Jun. 13, 2019

(65) Prior Publication Data
US 2020/0295218 A1 Sep. 17, 2020

(30) Foreign Application Priority Data
Dec. 5, 2017 (JP) .............................. JP2017-233038

(51) Int. Cl.
*H01L 31/107* (2006.01)
*G01S 17/93* (2020.01)
(Continued)

(52) U.S. Cl.
CPC ............ *H01L 31/107* (2013.01); *G01S 17/93* (2013.01); *H01L 31/03529* (2013.01); *H01L 31/03682* (2013.01); *H01L 31/1016* (2013.01)

(58) Field of Classification Search
CPC ............ H01L 31/107; H01L 31/02027; H01L 31/03529; H01L 27/14609; G01J 2001/4466
See application file for complete search history.

(56) References Cited

U.S. PATENT DOCUMENTS 4,406,913 A * 9/1983 Weyrich .......... H01L 31/035281
136/255
5,162,887 A * 11/1992 Dierschke ............. H01L 31/103
257/463
(Continued)

FOREIGN PATENT DOCUMENTS

JP 5600690 10/2014

OTHER PUBLICATIONS

International Search Report and Written Opinion prepared by the European Patent Office dated Dec. 14, 2018, for International Application No. PCT/JP2018/035165.

*Primary Examiner* — Eric K Ashbahian
(74) *Attorney, Agent, or Firm* — Sheridan Ross P.C.

(57) ABSTRACT

An avalanche photodiode (APD) sensor includes a photoelectric conversion region disposed in a substrate and that converts light incident to a first side of the substrate into electric charge, and a cathode region disposed at a second side of the substrate. The second side is opposite the first side. The APD sensor includes an anode region disposed at the second side of the substrate, a first region of a first conductivity type disposed in the substrate, and a second region of a second conductivity type disposed in the substrate. The second conductivity type is different than the first conductivity type. In a cross-sectional view, the first region and the second region are between the photoelectric conversion region and the second side of the substrate. In the (Continued)

cross-sectional view, an interface between the first region and the second region has an uneven pattern.

20 Claims, 23 Drawing Sheets

(51) Int. Cl.
*H01L 31/0352* (2006.01)
*H01L 31/0368* (2006.01)
*H01L 31/101* (2006.01)

(56) References Cited

U.S. PATENT DOCUMENTS

| | | | |
|---|---|---|---|
| 16,707,075 | | 3/2004 | Rogers et al. |
| 8,476,730 | B2 * | 7/2013 | Sanfilippo ............. H01L 31/107 |
| | | | 257/465 |
| 2011/0298076 | A1 | 12/2011 | Yamamura et al. |
| 2013/0193546 | A1 * | 8/2013 | Webster ................. H01L 31/18 |
| | | | 257/438 |
| 2015/0054111 | A1 * | 2/2015 | Niclass ................ H01L 31/107 |
| | | | 257/438 |
| 2016/0377423 | A1 * | 12/2016 | Eilers ...................... H04L 63/08 |
| | | | 356/601 |
| 2017/0092801 | A1 * | 3/2017 | Moussy .......... H01L 31/022408 |
| 2018/0019268 | A1 * | 1/2018 | Zhang .................. H01L 31/107 |
| 2018/0190692 | A1 * | 7/2018 | Choi ................. H01L 27/14614 |
| 2019/0097075 | A1 * | 3/2019 | Rae .................... H01L 27/1443 |

* cited by examiner

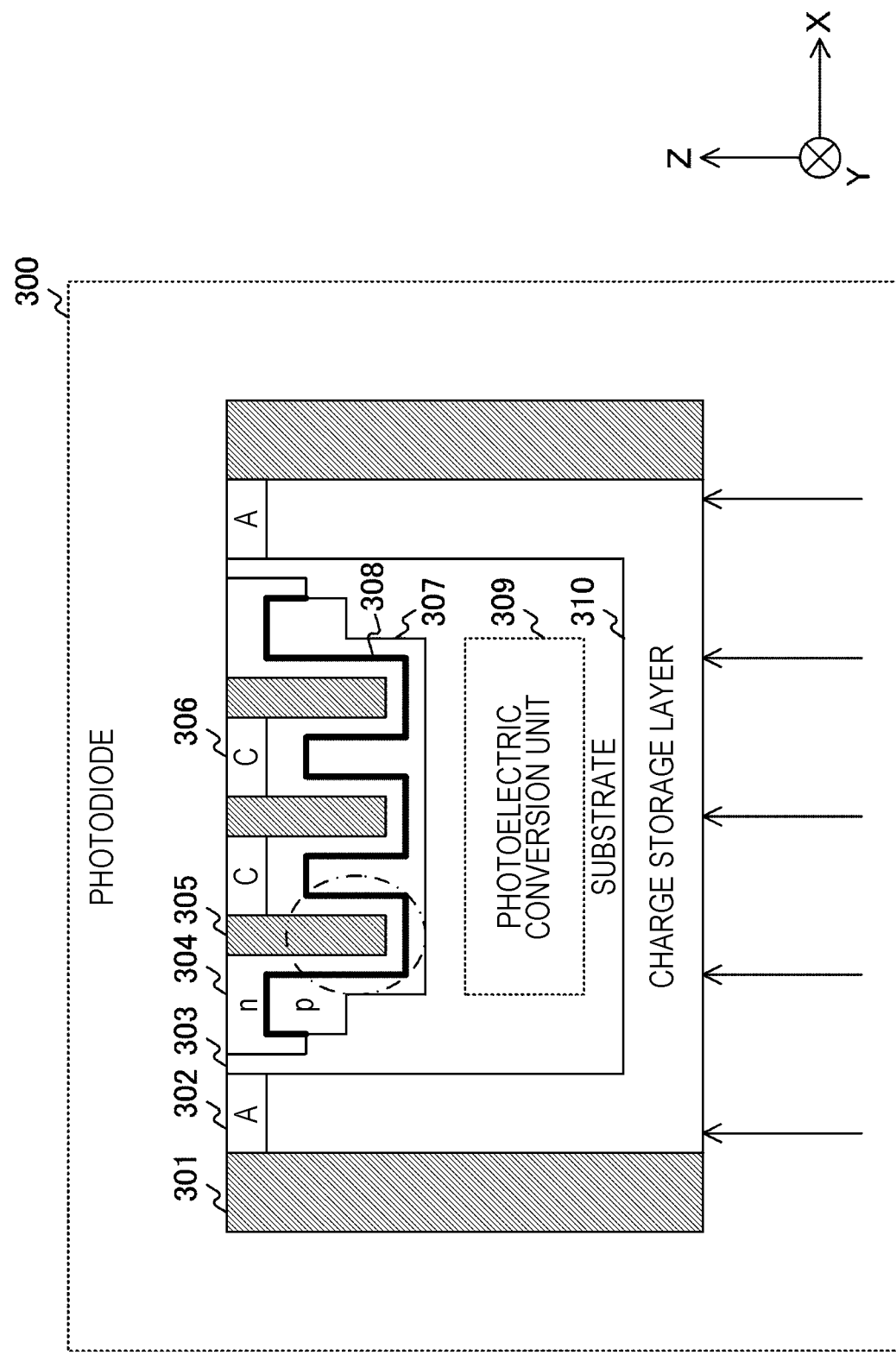

FIG. 18
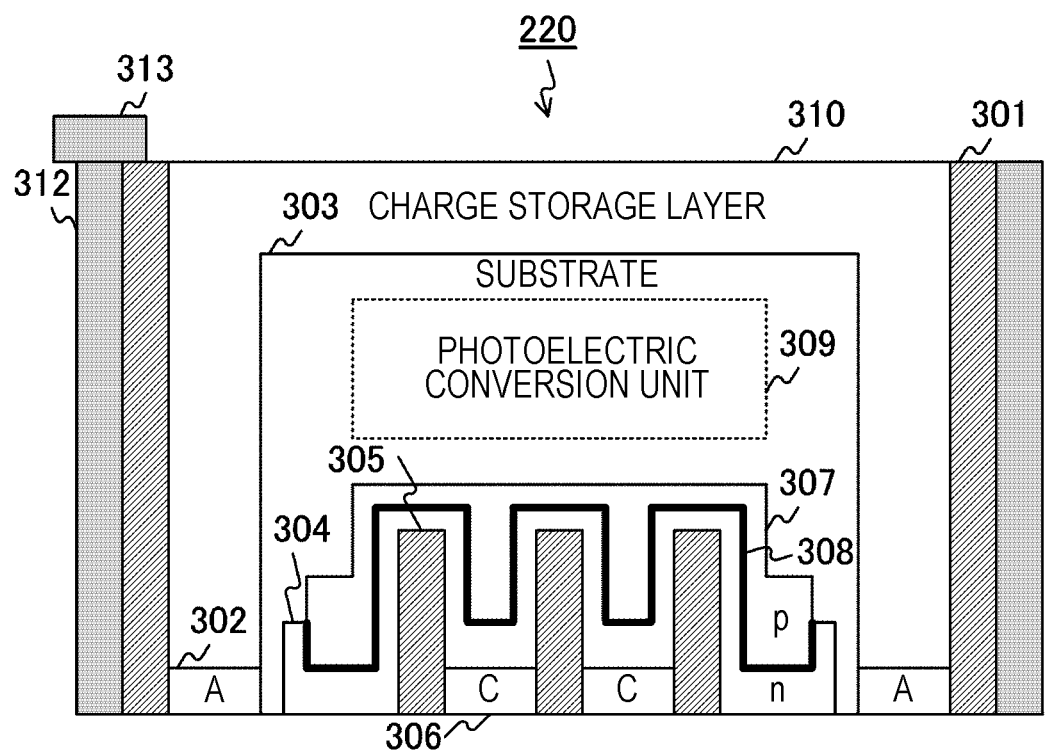
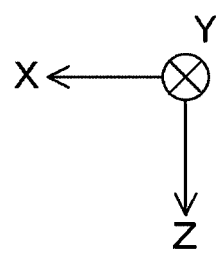

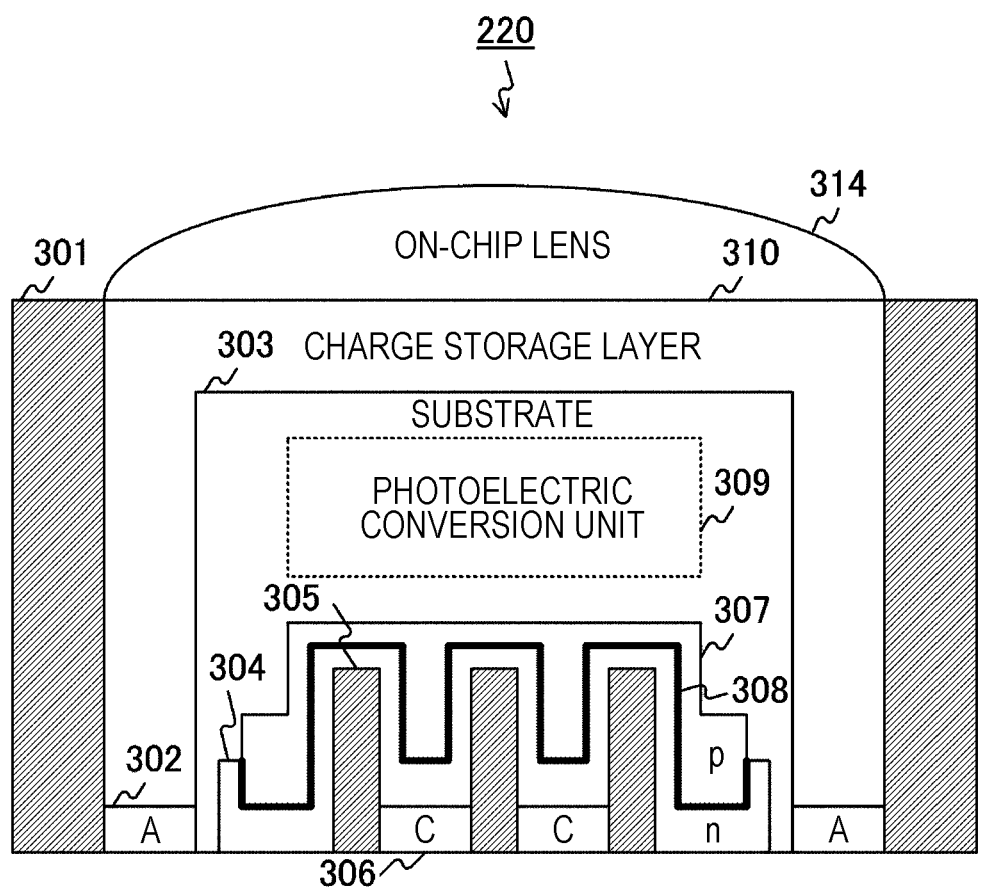
FIG. 19
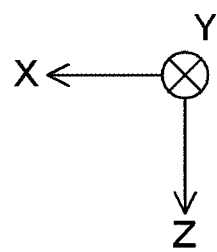

FIG. 20
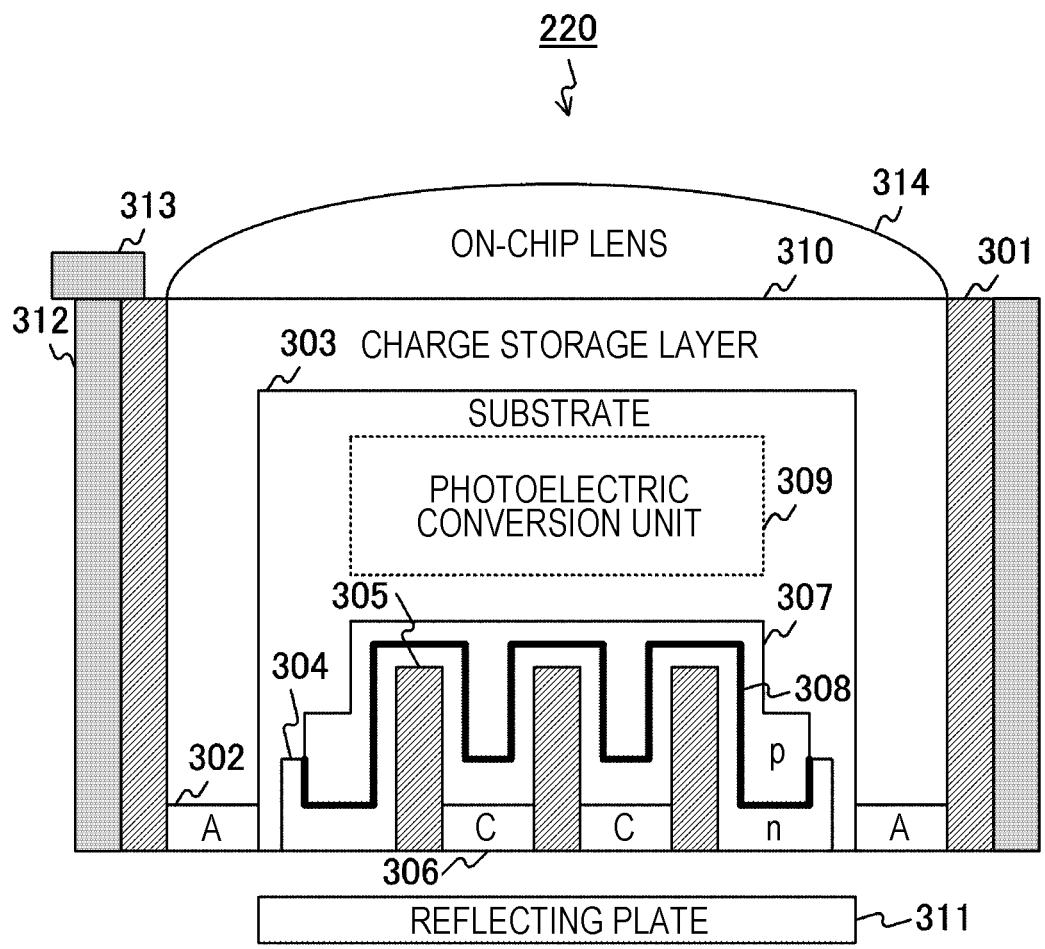
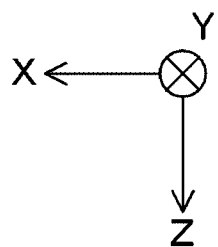

AVALANCHE PHOTODIODE SENSOR, AND ELECTRONIC DEVICE

CROSS REFERENCE TO RELATED APPLICATIONS

This application is a national stage application under 35 U.S.C. 371 and claims the benefit of PCT Application No. PCT/JP2018/035165 having an international filing date of 21 Sep. 2018, which designated the United States, which PCT application claimed the benefit of Japanese Patent Application No. 2017-233038 filed 5 Dec. 2017, the entire disclosures of each of which are incorporated herein by reference.

TECHNICAL FIELD

The present technology relates to a photodiode, an avalanche photodiode sensor, and an electronic device, and particularly to, an avalanche photodiode sensor that amplifies a photocurrent, and an electronic device.

BACKGROUND ART

Recently, a device called single photon avalanche diode (SPAD), which realizes optical communication, distance measurement, photon count, and the like by sensing a very weak optical signal, has been developed and studied. The SPAD is an avalanche photodiode with high sensitivity capable of detecting one photon. For example, a SPAD, in which an amplification region that performs avalanche amplification, is disposed to be parallel with a light incident surface, is suggested (for example, refer to Patent Literature 1). Here, the avalanche amplification is a phenomenon in which a charge is accelerated due to avalanche breakdown, and a photocurrent from a photoelectric conversion unit is amplified.

CITATION LIST

Patent Literature

PTL 1: JP 2015-41746A

SUMMARY

Technical Problem

In the related art, the photocurrent is amplified by the amplification region. Accordingly, even though incident light is weak, the incident light can be detected. However, there is a problem that an area of the amplification region becomes narrow along with a decrease in size of pixels, and thus an amplification rate decreases. When the amplification rate decreases, pixel characteristics such as sensitivity of pixels, quantum efficiency, and photon detection efficiency (PDE) deteriorates, and thus it is preferable that the amplification rate is high.

The present technology has been made in consideration of the above-described situation, and it is desirable that an amplification rate of a photocurrent is improved in a solid-state imaging element in which an avalanche photodiode is provided.

Solution to Problem

The present technology has been made to solve the problem. According to a first aspect, an avalanche photodiode (APD) sensor includes a photoelectric conversion region disposed in a substrate and that converts light incident to a first side of the substrate into electric charge, and a cathode region disposed at a second side of the substrate. The second side is opposite the first side. The APD sensor includes an anode region disposed at the second side of the substrate, a first region of a first conductivity type disposed in the substrate, and a second region of a second conductivity type disposed in the substrate. The second conductivity type is different than the first conductivity type. In a cross-sectional view, the first region and the second region are between the photoelectric conversion region and the second side of the substrate. In the cross-sectional view, an interface between the first region and the second region has an uneven pattern.

In the cross sectional view, the uneven pattern is a comb pattern with a plurality of teeth.

In the cross sectional view, the first region surrounds three sides of the cathode region.

The APD sensor includes at least one trench penetrating first region and the cathode region from the second side. The at least one trench includes one of an oxide material or a semiconductor material having a different crystal structure than the substrate. For example, the at least one trench is filled with one of the oxide material or the semiconductor material having the different crystal structure than the substrate.

The at least one trench includes one of an oxide material, a semiconductor material, or a conductive material. For example, the at least one trench is filled with one of the oxide material, the semiconductor material, or the conductive material. The oxide material includes one of silicon oxide or hafnium oxide, the semiconductor material includes silicon having a different crystal structure than the substrate, and the conductive material includes one of tungsten or copper.

The at least one trench includes a plurality of trenches and, in a plan view, the plurality of trenches form one of a plurality of linear shapes, a plurality of shapes arranged in a matrix, or a mesh shape.

In the cross sectional view, at least one of the plurality of trenches includes a portion that extends into the first region so as to be between sections of the uneven pattern of the interface.

The APD sensor further includes a pixel isolation layer formed in the substrate to isolate the photoelectric conversion region from an adjacent photoelectric conversion region.

According to a second aspect of the present technology, an APD sensor includes a photoelectric conversion region disposed in a substrate and that converts light incident to a first side of the substrate into electric charge, and a cathode region disposed at a second side of the substrate. The second side is opposite the first side. The APD sensor includes an anode region disposed at the second side of the substrate, a first region of a first conductivity type disposed in the substrate, and a second region of a second conductivity type disposed in the substrate. The second conductivity type is different than the first conductivity type. The APD sensor includes at least one trench that penetrates the first region and the cathode region from the second side. In a cross-sectional view, the first region and the second region are between the photoelectric conversion region and the second side of the substrate. In the cross-sectional view, an interface between the first region and the second region has an uneven pattern.

In the cross sectional view, the uneven pattern is a comb pattern with a plurality of teeth.

In the cross sectional view, the at least one trench includes a portion that extends into the first region so as to be between neighboring teeth.

The at least one trench includes a plurality of trenches. In a plan view, the plurality of trenches form one of a plurality of linear shapes, a plurality of shapes arranged in a matrix, or a mesh shape.

The plurality of trenches include one of an oxide material or a semiconductor material having a different crystal structure than the substrate.

The plurality of trenches include one of an oxide material, a semiconductor material, or a conductive material.

The APD sensor further includes a pixel isolation layer formed in the substrate to isolate the photoelectric conversion region from an adjacent photoelectric conversion region.

In a plan view, the anode region surrounds the first region, the second region, and the cathode region.

According to a third aspect of the present technology, an electronic device includes a controller and an APD sensor. The APD sensor includes a photoelectric conversion region disposed in a substrate and that converts light incident to a first side of the substrate into electric charge, and a cathode region disposed at second side of the substrate. The second side is opposite the first side. The APD sensor includes an anode region disposed at the second side of the substrate, a first region of a first conductivity type disposed in the substrate, and a second region of a second conductivity type disposed in the substrate. The second conductivity type is different than the first conductivity type. In a cross-sectional view, the first region and the second region are between the photoelectric conversion region and the second side of the substrate. In the cross-sectional view, an interface between the first region and the second region has an uneven pattern.

In a plan view, the anode region surrounds the first region, the second region, and the cathode region.

Advantageous Effects of Invention

According to the present technology, it is possible to attain an excellent effect capable of improving an amplification rate of a photocurrent in a solid-state imaging element in which an avalanche photodiode is provided. Furthermore, the effect stated here is not limited, and may be any one effect described in the present technology.

BRIEF DESCRIPTION OF DRAWINGS

FIG. 5 is an example of a cross-sectional view of the photodiode according to the first embodiment of the present technology.

FIG. 18 is an example of a cross-sectional view of a pixel circuit according to a fifth embodiment of the present technology.

FIG. 19 is an example of a cross-sectional view of a pixel circuit according to a sixth embodiment of the present technology.

FIG. 20 is an example of a cross-sectional view of a pixel circuit according to a seventh embodiment of the present technology.

DESCRIPTION OF EMBODIMENTS

Hereinafter, embodiments for carrying out the present technology (hereinafter, referred to as embodiments) will be described. Description will be made in the following order.

1. First Embodiment (Example in Which Recess Portion is Provided in Amplification Region)

2. Second Embodiment (Example in Which n-Layer is Buried in Substrate, and Recess Portion is Provided in Amplification Region)

3. Third Embodiment (Example in Which Recess Portion is Provided in Amplification Region in Stacked Chip)

4. Fourth Embodiment (Example in Which Reflection Plate is Disposed, and Recess Portion is Provided in Amplification Region)

5. Fifth Embodiment (Example in Which Light-Shielding Wall is Disposed, and Recess Portion is Provided in Amplification Region)

6. Sixth Embodiment (Example in which On-Chip Lens is Disposed, and Recess Portion is Provided in Amplification Region)

7. Seventh Embodiment (Example in Which Reflection Plate, Light-Shielding Wall, and On-Chip Lens are disposed, and Recess Portion is Provided in Amplification Region)

8. Eighth Embodiment (Example in Which Recess Portion is Provided in Amplification Region in Imaging Device)

9. Application Example to Moving Body

1. First Embodiment

"Configuration Example of Distance Measurement Module"

Figure 1:
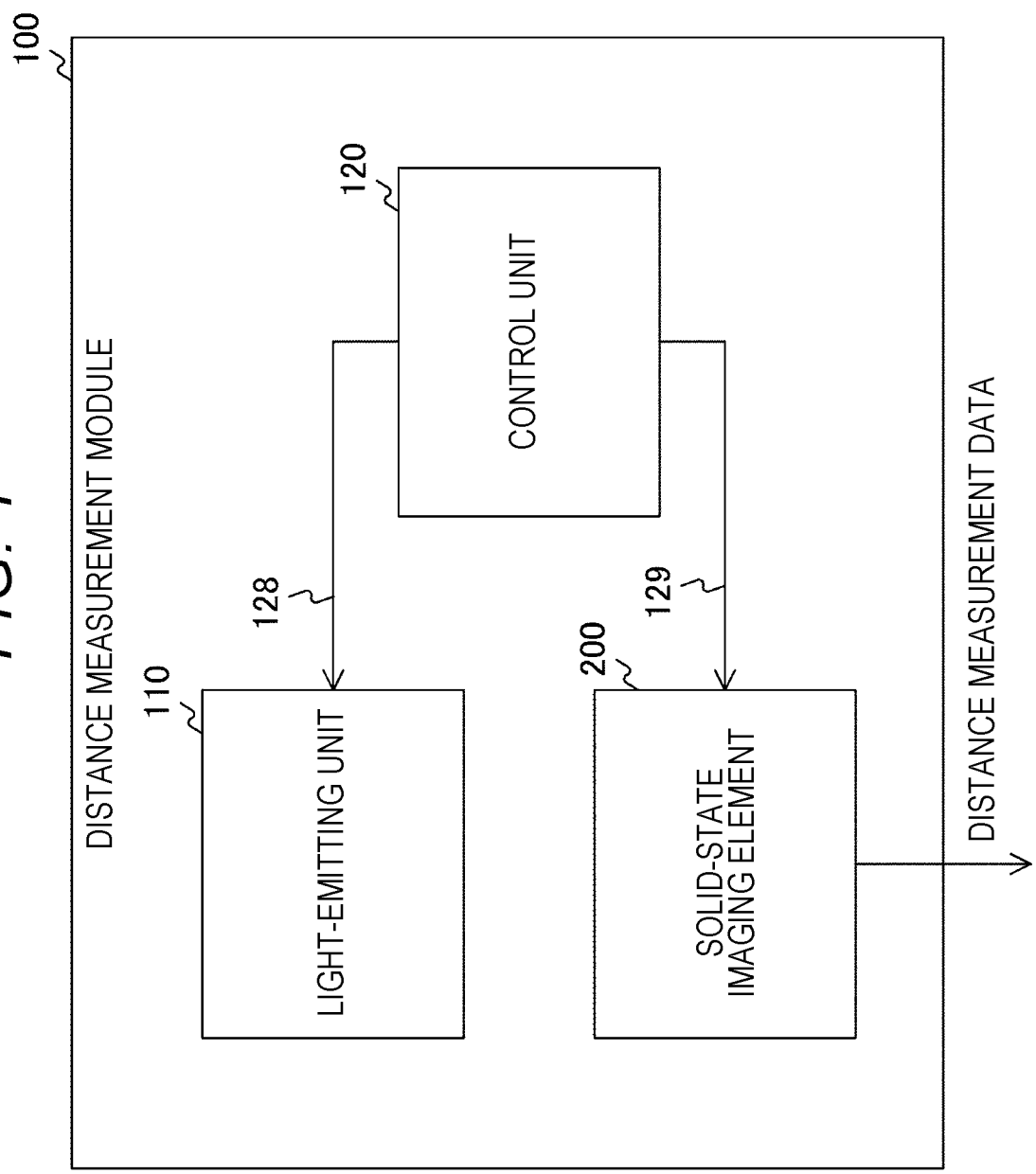
FIG. 1 is a block diagram illustrating a configuration example of a distance measurement module according to a first embodiment of the present technology.

FIG. 1 is a block diagram illustrating a configuration example of a distance measurement module 100 according to this embodiment of the present technology. The distance measurement module 100 is an electronic apparatus that measures a distance by a time of flight (ToF) method, and includes a light-emitting unit 110, a control unit 120, and a solid-state imaging element (or avalanche photodiode (APD) sensor) 200. Furthermore, the distance measurement module 100 is an example of an electronic apparatus described in the appended claims.

The light-emitting unit 110 intermittently emits irradiation light to irradiate an object with the irradiation light. For example, the light-emitting unit 110 generates irradiation light in synchronization with a light-emission control signal of a rectangular wave. In addition, for example, a photodiode can be used as the light-emitting unit 110, and near infrared light and the like can be used as the irradiation light. Furthermore, the light-emission control signal is not limited to the rectangular wave as long as the light-emission control signal is a periodic signal. For example, the light-emission control signal may be a sinusoidal wave. In addition, the irradiation light may be visible light and the like without limitation to near infrared light.

The control unit 120 controls the light-emitting unit 110 and the solid-state imaging element 200. The control unit 120 generates the light-emission control signal and supplies the light-emission control signal to the light-emitting unit 110 and the solid-state imaging element 200 through signal lines 128 and 129. For example, a frequency of the light-emission control signal may be 20 megahertz (MHz). Furthermore, the frequency of the light-emission control signal may be 5 megahertz (MHz) and the like without limitation to 20 megahertz (MHz).

The solid-state imaging element 200 receives reflected light of the intermittent irradiation light and measures a distance from an object by the ToF method. The solid-state imaging element 200 generates distance measurement data indicating a measured distance and outputs the distance measurement data to an outer side.

"Configuration Example of Solid-State Imaging Element"

Figure 2:
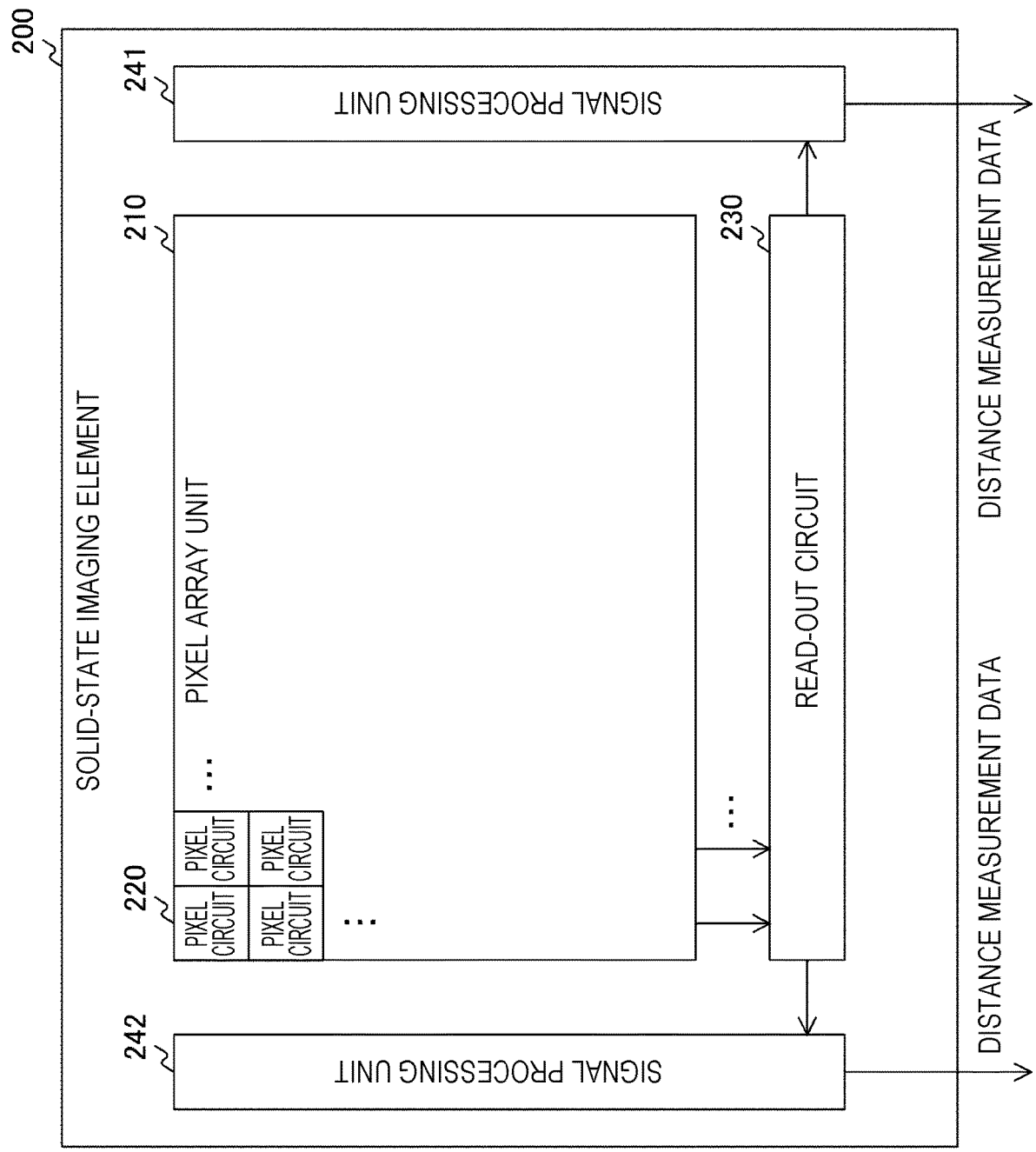
FIG. 2 is a block diagram illustrating a configuration example of the solid-state imaging element according to the first embodiment of the present technology.

FIG. 2 is a block diagram illustrating a configuration example of the solid-state imaging element 200 according to the first embodiment of the present technology. The solid-state imaging element 200 includes a pixel array unit 210, a read-out circuit 230, and signal processing units 241 and 242. These circuits are provided in a single semiconductor chip. In the pixel array unit 210, a plurality of pixel circuits 220 are arranged in a two-dimensional lattice shape.

Each of the pixel circuits 220 generates a pulse signal through photoelectric conversion of incident light. The read-out circuit 230 reads out pulse signals from the pixel circuits 220. The read-out circuit 230 supplies approximately the half of the pulse signals which are read out to the signal processing unit 241 and supplies the remainder of the pulse signal to the signal processing unit 242.

The signal processing unit 241 clocks a turnaround time from a light-emission timing indicated by a light-emission control signal to a light-reception timing indicated by a pulse signal by using time to digital converter (TDC) and the like. The signal processing unit 241 divides a value, which is obtained by multiplying the clocked turnaround time by velocity of light, by two to calculate a distance from an object, and generate distance data that represents the distance. A configuration of the signal processing unit 242 is similar to that of the signal processing unit 241.

"Configuration Example of Pixel Circuit"

Figure 3:
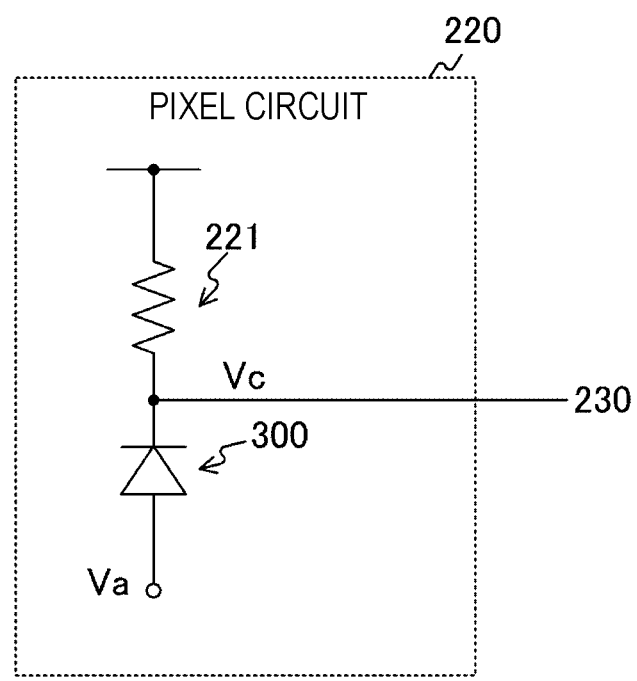
FIG. 3 is a circuit diagram illustrating a configuration example of a pixel circuit according to the first embodiment of the present technology.

FIG. 3 is a circuit diagram illustrating a configuration example of a pixel circuit 220 according to the first embodiment of the present technology. The pixel circuit 220 includes a resistor 221 and a photodiode 300. Furthermore, in the same drawing, circuits and elements other than the resistor 221 and the photodiode 300 are omitted.

The resistor 221 is inserted between a power supply and a cathode (or cathode region) of a photodiode 300. The photodiode 300 amplifies light through photoelectric conversion. For example, a SPAD can be used as the photodiode 300.

A dark-state cathodic potential of the photodiode 300 is set as Vop. When the photodiode 300 receives reflected light and performs avalanche amplification, a large current flows to the resistor 221 and voltage drop occurs. When the cathodic potential decreases to a potential Vbd at which the avalanche amplification does not occur due to the voltage drop, the large current stops. This phenomenon is referred to as "quench".

Next, charges collected in the photodiode 300 are leaked due to recharge by the potential Vop, and the cathodic potential returns to the potential Vop from the potential Vbd immediately after the quench. Due to returning to the potential Vop, the photodiode 300 can response to a photon.

Furthermore, the pixel circuit 220 is provided in the distance measurement module 100, but the pixel circuit 220 may be provided in an electronic apparatus other than the distance measurement module 100. For example, the pixel circuit 220 can be used in a circuit and the like which perform optical communication, or a circuit and the like which perform photon count.

"Configuration Example of Photodiode"

Figure 4:
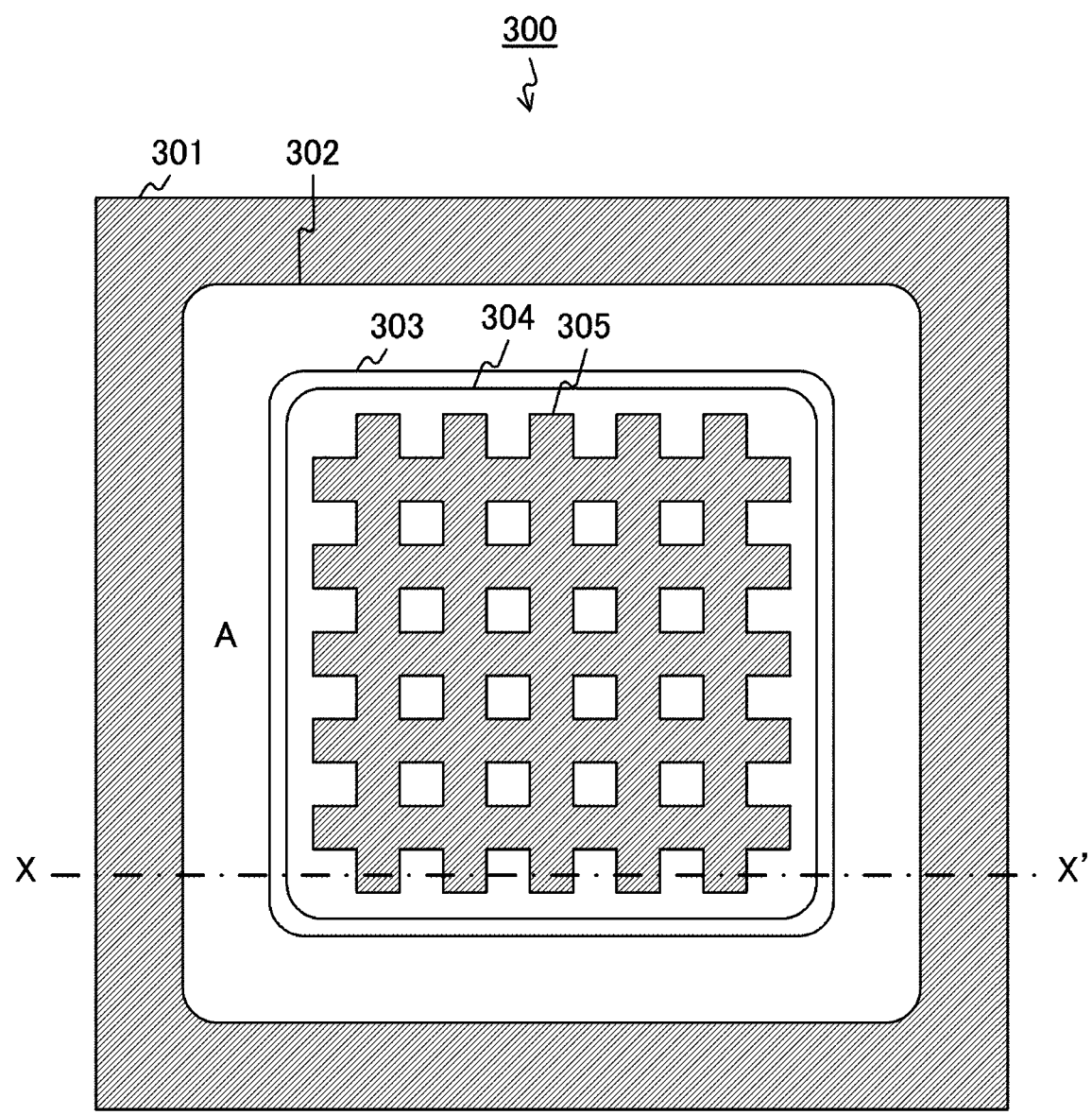
FIG. 4 is an example of a plan view of a photodiode according to the first embodiment of the present technology.

FIG. 4 is an example of a plan view of the photodiode 300 according to the first embodiment of the present technology. The photodiode 300 is formed in a predetermined semiconductor substrate 303 having a first side and a second side opposite the first side, and a predetermined direction that is perpendicular to a substrate plane is set as a Z direction. In addition, a predetermined direction that is parallel to the substrate plane is set as an X direction, and a direction perpendicular to the X direction and the Z direction is set as a Y direction.

In the substrate plane, an inter-pixel isolation layer (or pixel isolation layer) 301 that isolates pixels is formed at an outer periphery of the photodiode 300. For example, the inter-pixel isolation layer 301 isolates the photoelectric conversion unit 309 from a neighboring photoelectric conversion unit. In addition, an anode (or anode region) 302 is disposed on an inner side of the inter-pixel isolation layer 301. An n-layer (or region) 304 including n-type impurities is formed on an inner side of the anode 302. In the n-layer 304, a trench 305 is formed in a mesh shape.

FIG. 5 is an example of a cross-sectional view of the photodiode 300 according to the first embodiment of the present technology. The same drawing is a cross-sectional view when cutting the photodiode 300 along an X-X' axis that is parallel to the X direction in FIG. 4.

In both surfaces of the semiconductor substrate 303, a surface on which a circuit is disposed is set as a front surface, and a rear surface opposite to the front surface is irradiated with light. An arrow in FIG. 5 indicates incident direction of light. The solid-state imaging element 200 of which the rear surface is irradiated with light is referred to as rear-surface irradiation type solid-state imaging element. Furthermore, the solid-state imaging element 200 may have a configuration of a front-surface irradiation type in which the front surface is irradiated with light.

The inter-pixel isolation layer 301 is formed on a lateral surface of the photodiode 300 along the Z direction. In addition, a charge storage layer 310 that stores a charge is formed along the rear surface and an inner side of the inter-pixel isolation layer 301.

A photoelectric conversion unit (or photoelectric conversion region) 309 that converts incident light into a charge is formed in the semiconductor substrate 303 on an inner side of the charge storage layer 310. In a state in which a direction from the rear surface to the front surface is set as an upward direction, a p-layer (or region) 307 including p-type impurities is formed on an upper side of the photoelectric conversion unit 309. In addition, the n-layer 304 is formed on an upper side of the p-layer 307.

Here, it is assumed that the semiconductor substrate 303 includes n-type impurities or p-type impurities, and an impurity concentration thereof is lower in comparison to the n-layer 304 and the p-layer 307. For example, the impurity concentration of the semiconductor substrate 303 is set to 1E-14 or less. In addition, a bold line indicates an interface between the n-layer 304 and the p-layer 307, and the interface corresponds to an amplification region 308 that performs avalanche amplification with respect to a photo-electrically converted charge. As shown, the interface may have an uneven pattern. For example, the uneven pattern may be a comb pattern with a plurality of teeth. The trench(es) 305 may include a portion that extends into the region 304 so as to be between sections of the uneven pattern of the interface. For example, each trench 305 may include a portion that extends into the region 304 so as to be between neighboring teeth in the comb pattern.

A part of the n-layer 304 is exposed to the front surface of the semiconductor substrate 303. In addition, the trench 305 that extends in the Z direction perpendicular to the front surface is formed in the front surface of the semiconductor substrate 303. The trench 305 includes or is filled with a predetermined filling material. As the filling material, a material (oxide film and the like) different from that of the semiconductor substrate 303, or silicon (e.g., Si, polysilicon and/or the like) having a crystal structure different from that of the semiconductor substrate 303 can be used. The filling material may also include a conductive material (e.g., different than polysilicon). For example, the oxide material may include silicon oxide (e.g., $SiO_2$) or hafnium oxide (e.g., HfO), the semiconductor material may include silicon having a different crystal structure than the substrate 303, and the conductive material may include one of tungsten or copper.

In addition, the anode 302 and a cathode 306 are formed on the front surface of the semiconductor substrate 303. The cathode 306 is connected to the resistor 221, and an amplified charge (electron) is output from the electrode. In addition, a predetermined anodic potential is applied to the anode 302. Furthermore, the cathode 306 is an example of an electrode described in the appended claims.

In addition, the amplification region 308 is formed along a lateral surface of the trench 305 that extends in the Z direction. Accordingly, in the amplification region 308, recess portions recessed in the Z direction perpendicular to the front surface of the semiconductor substrate 303 are formed in a number (for example, three pieces) corresponding to the number of the trenches 305. In the amplification region 308, a portion surrounded by a one-dot chain line indicates one among the three recess portions. Furthermore, in the cross-sectional view of FIG. 5, the number of the trenches 305 is set to three, but two trenches among five trenches on an X-X axis in FIG. 4 are omitted for convenience.

When the recess portions are formed in the amplification region 308 and thus the amplification region 308 becomes a complicated shape, it is possible to further widen a surface area of the amplification region 308 in comparison to a case where the amplification region 308 has a flat shape without being provided with the recess portions.

Here, in an avalanche photodiode that typically performs avalanche amplification, the further a pixel is made to be fine, the narrower the surface area of the amplification region 308 becomes. In addition, the avalanche amplification does not typically occur whenever a photon is incident, and the avalanche amplification occurs with a constant probability. The narrower the surface area of the amplification region 308 is, the further the probability decreases. In a small-sized avalanche photodiode, there is a concern that sensitivity, quantum efficiency, and photon detection efficiency may deteriorate due to the decrease in the probability of occurrence of the avalanche amplification. In addition, a problem that optical crosstalk deteriorates also occurs.

In contrast, in the photodiode 300, since the recess portions are provided in the amplification region 308, and the surface area of the amplification region 308 is widened, an amplification rate is raised, and thus it is possible to suppress a decrease in sensitivity and photon detection efficiency.

"Method of Manufacturing Photodiode"

Figure 6A:
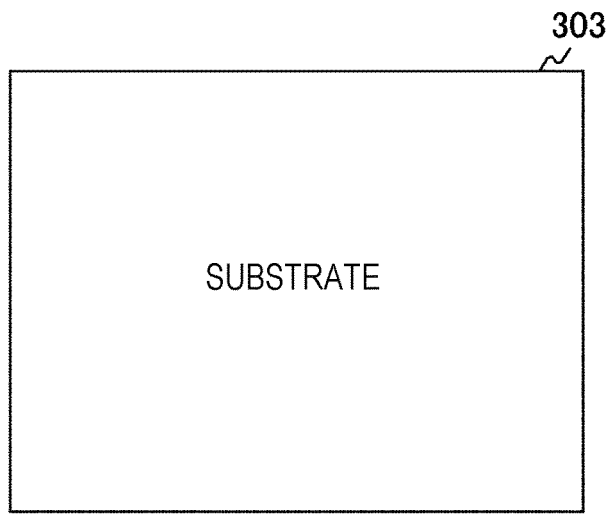
FIGS. 6A-6C are views illustrating a method of manufacturing a photodiode before a thermal process according to the first embodiment of the present technology.
Figure 6B:
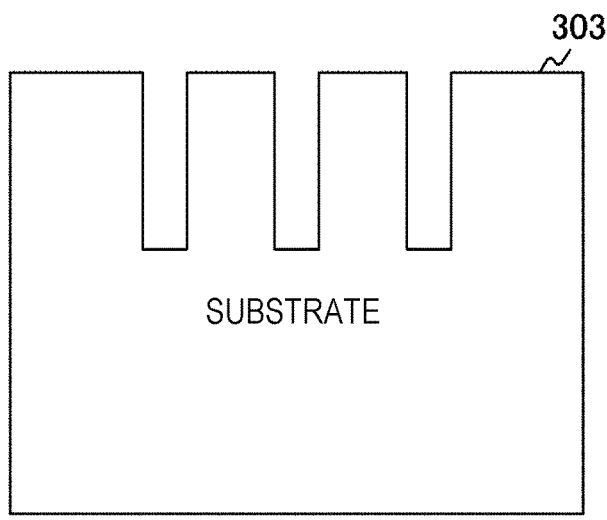
Figure 6C:
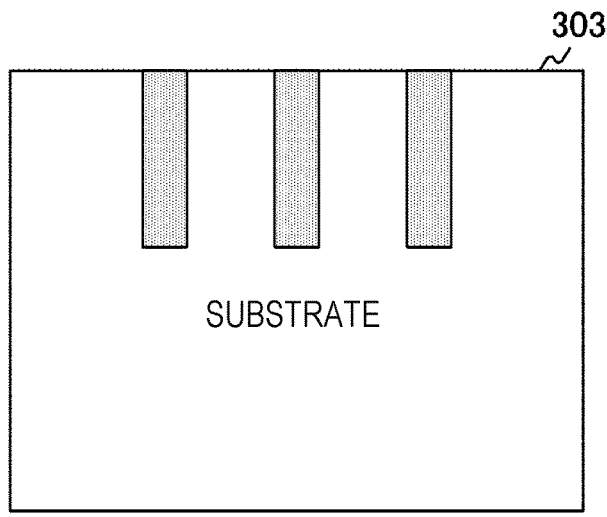

FIGS. 6A-6C are views illustrating a method of manufacturing the photodiode 300 before a thermal process according to the first embodiment of the present technology. FIG. 6A represents a cross-sectional view of the semiconductor substrate 303 when manufacturing is initiated. FIG. 6B represents a cross-sectional view of the semiconductor substrate 303 after forming a trench. FIG. 6C represents a cross-sectional view of the semiconductor substrate 303 in which impurities are buried in the trench.

A manufacturing system of the photodiode 300 processes the semiconductor substrate 303 in "FIG. 6A, and form a trench as illustrated in FIG. 6B. In addition, as illustrated FIG. 6C, the manufacturing system buries p-type or n-type impurities in the trench.

Figure 7:
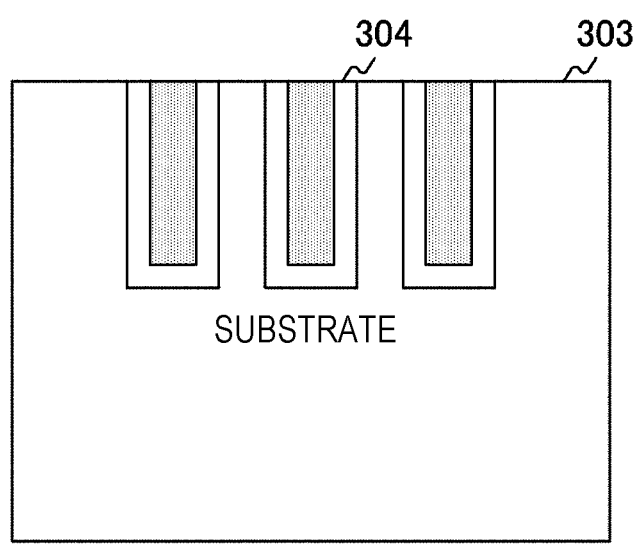
FIG. 7 is an example of a cross-sectional view of the photodiode after the thermal process according to the first embodiment of the present technology.

FIG. 7 is an example of a cross-sectional view of a photodiode after the thermal process according to the first embodiment of the present technology. The manufacturing system performs a heat treatment such as annealing to diffuse the impurities to the periphery of the trench. According to this, the n-layer 304 or the p-layer 307 is formed at the periphery of the trenches. In the same drawing, a view after forming the p-layer 307 is omitted.

Figure 8:
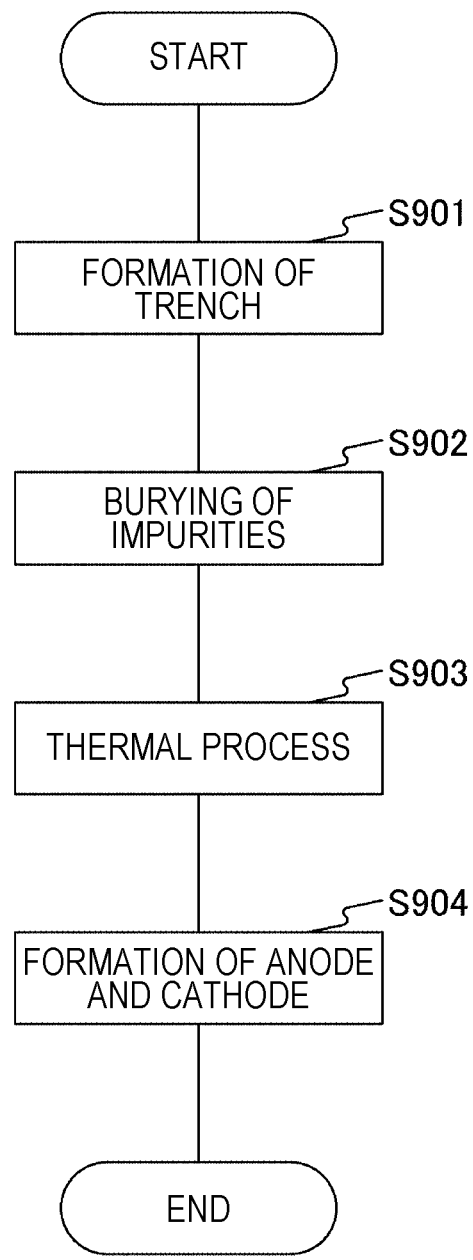
FIG. 8 is a flowchart illustrating an example of the method of manufacturing the photodiode according to the first embodiment of the present technology.

FIG. 8 is a flowchart illustrating an example of the method of manufacturing a photodiode according to the first embodiment of the present technology. The manufacturing system forms a trench in a semiconductor substrate (step S901), and buries impurities in the trench (step S902).

In addition, the manufacturing system forms the n-layer 304 and the like by the thermal process (step S903). In a case of using the trench, it is more effective to form the amplification region 308 through plasma doping or solid-phase diffusion. In addition, the manufacturing system forms an anode, a cathode, and the like (step S904), and terminates a manufacturing process of the photodiode 300.

As described above, according to the first embodiment of the present technology, the recess portion is formed in the amplification region 308 that performs avalanche amplification with respect to a charge, and thus it is possible to further widen the surface area of the amplification region 308 in comparison to a case where the recess portion is not formed. According to this, a probability of performing the avalanche amplification is improved, and thus it is possible to suppress a decrease in sensitivity and photon detection efficiency of the photodiode 300.

First Modification Example

In the first embodiment, the amplification region 308 is formed through a heat treatment, but there is a concern that an adverse effect such as deformation of the semiconductor substrate 303 may occur due to the heat treatment. In a photodiode 300 of a first modification example of the first embodiment is different from the first embodiment in that the amplification region 308 is formed through ion implantation.

Figure 9:
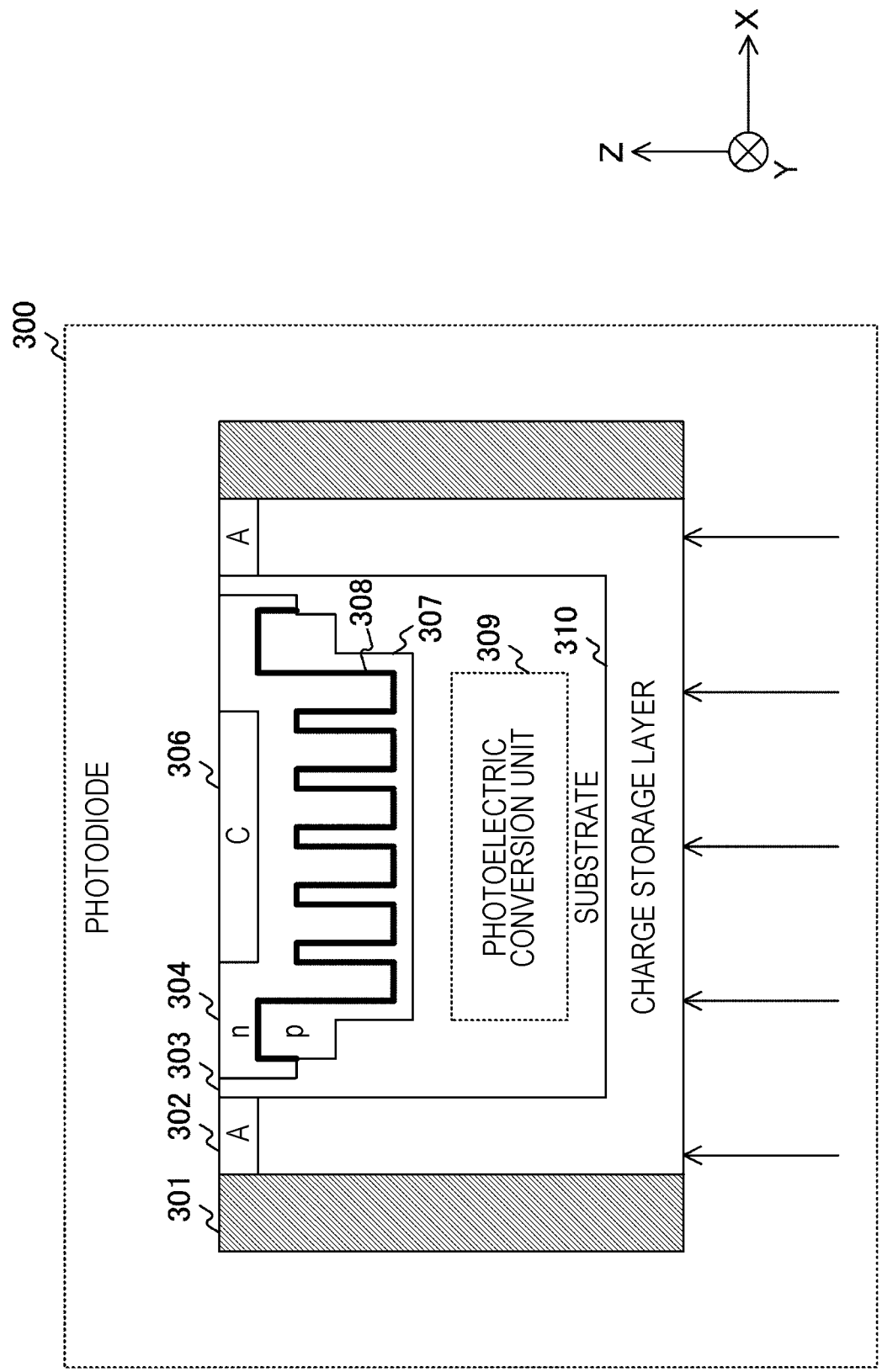
FIG. 9 is an example of a cross-sectional view of a photodiode according to a first modification example of the first embodiment of the present technology.

FIG. 9 is an example of a cross-sectional view of the photodiode 300 according to the first modification example of the first embodiment of the present technology. In the first modification example of the first embodiment, the manufacturing system forms the amplification region 308 through ion implantation. The manufacturing system forms the p-layer 307 through ion implantation, and subsequently forms the n-layer 304. When forming the n-layer 304, the manufacturing system puts ions into a site, at which a recess portion is to be formed, up to a deeper position in comparison to the other sites. According to this, even though the heat treatment is not performed after forming a trench, it is possible to form the amplification region 308 having a recess portion.

As described above, in the first modification example of the first embodiment of the present technology, the amplification region 308 is formed through ion implantation, and thus it is possible to manufacture the photodiode 300 without performing a heat treatment.

Second Modification Example

In the first embodiment, the trench 305 is formed in the surface of the semiconductor substrate 303 in a mesh shape, and the further the shape of the trench is complicated, the wider the surface area of the amplification region 308 is. On the other hand, there is a concern that a defect on the surface increases. This defect becomes the cause for occurrence of noise on image data. A photodiode 300 according to a second modification example of the first embodiment is different from the first embodiment in that the shape of the trench is simplified into a linear shape.

Figure 10:
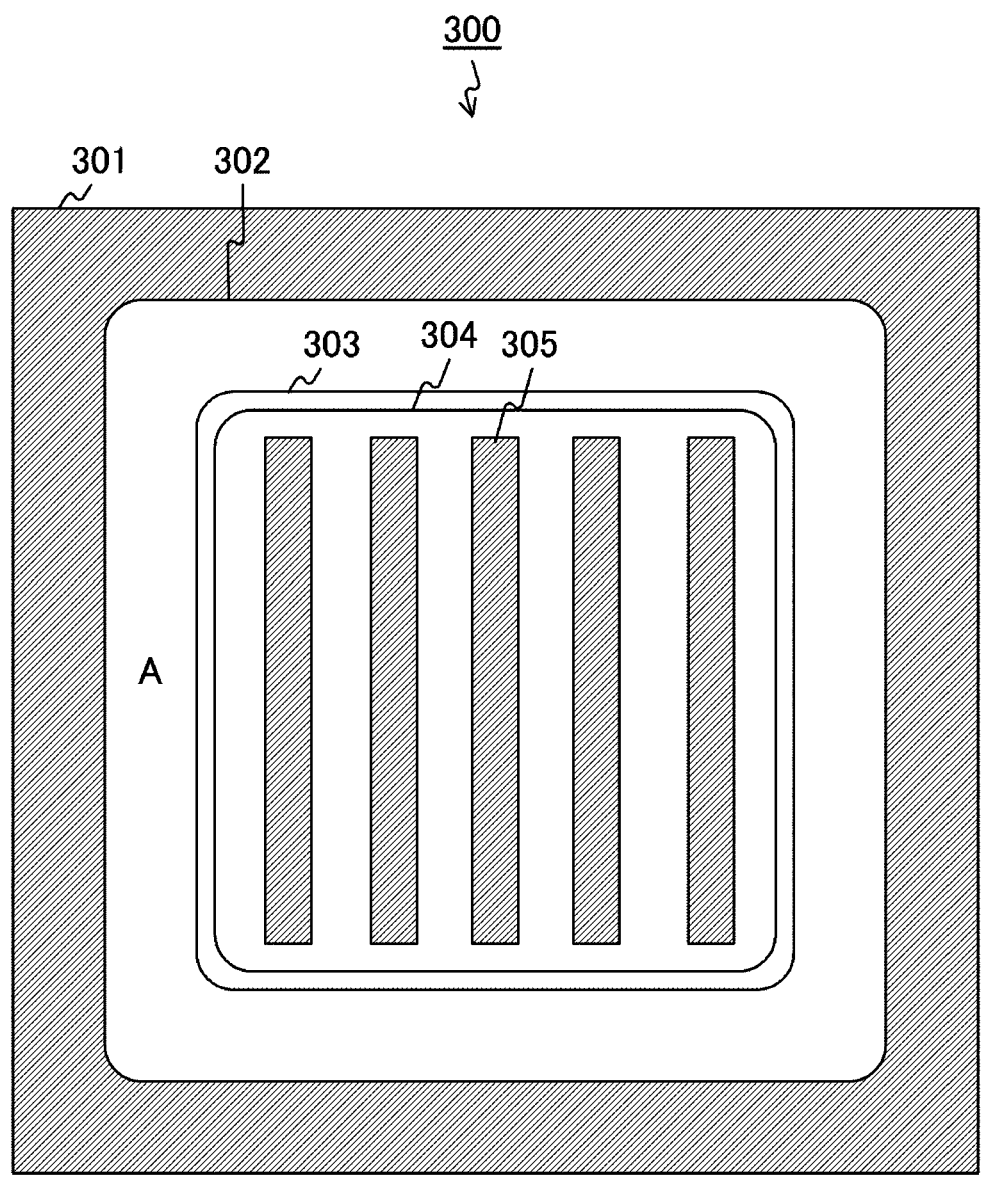
FIG. 10 is an example of a plan view of a photodiode according to a second modification example of the first embodiment of the present technology.

FIG. 10 is an example of a plan view of the photodiode 300 according to the second modification example of the first embodiment of the present technology. In the photodiode 300 of the second modification example of the first embodiment, a trench is formed in a linear shape when viewed from a substrate front surface. For example, a plurality of linear trenches 305 which extend in the Y direction are formed. In addition, in the amplification region 308, a linear recess portion is formed along the trenches 305. Furthermore, the drawing is a view when viewed from the front surface of the semiconductor substrate 303, and the amplification region 308 is formed at the inside of the semiconductor substrate 303 and is not exposed to the front surface.

When the shape of the trenches 305 and the recess portion is simplified, a defect that occurs due to processing decreases. On the other hand, the surface area of the amplification region 308 becomes narrow. According to this, the shape of the trenches 305 and the like is determined in comparative consideration of a demerit due to the defect and a merit due to an increase in the surface area.

As described above, according to the second modification example of the first embodiment of the present technology, the trenches 305 are formed in a linear shape, and thus it is possible to further reduce a defect in comparison to a case where the trenches 305 are formed in a mesh shape.

Third Modification Example

In the second modification example of the first embodiment, the shape of the trenches 305 is simplified into a linear shape. However, even in this shape, it may be difficult to sufficiently reduce a defect. A photodiode 300 of a third modification example of the first embodiment is different from the second modification example of the first embodiment in that the shape of the trenches is simplified and is set to a rectangular shape.

Figure 11:
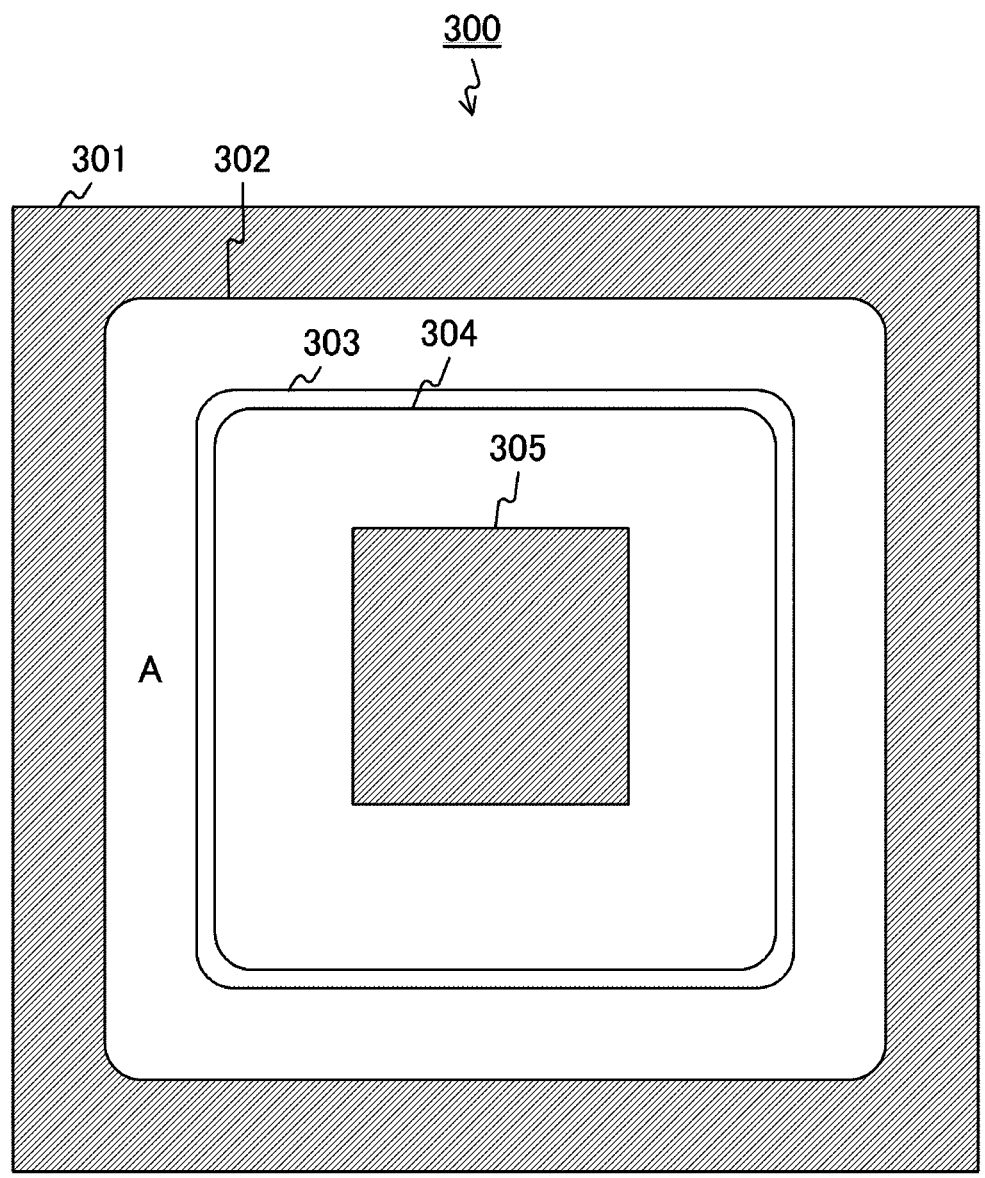
FIG. 11 is an example of a plan view of a photodiode according to a third modification example of the first embodiment of the present technology.

FIG. 11 is an example of a plan view of the photodiode according to the third modification example of the first embodiment of the present technology. In the photodiode 300 of the third modification example of the first embodiment, one rectangular trench 305 is disposed at the center when viewed form the substrate front surface. In addition, in the amplification region 308, a rectangular recess portion is formed along the trench 305.

Figure 12:
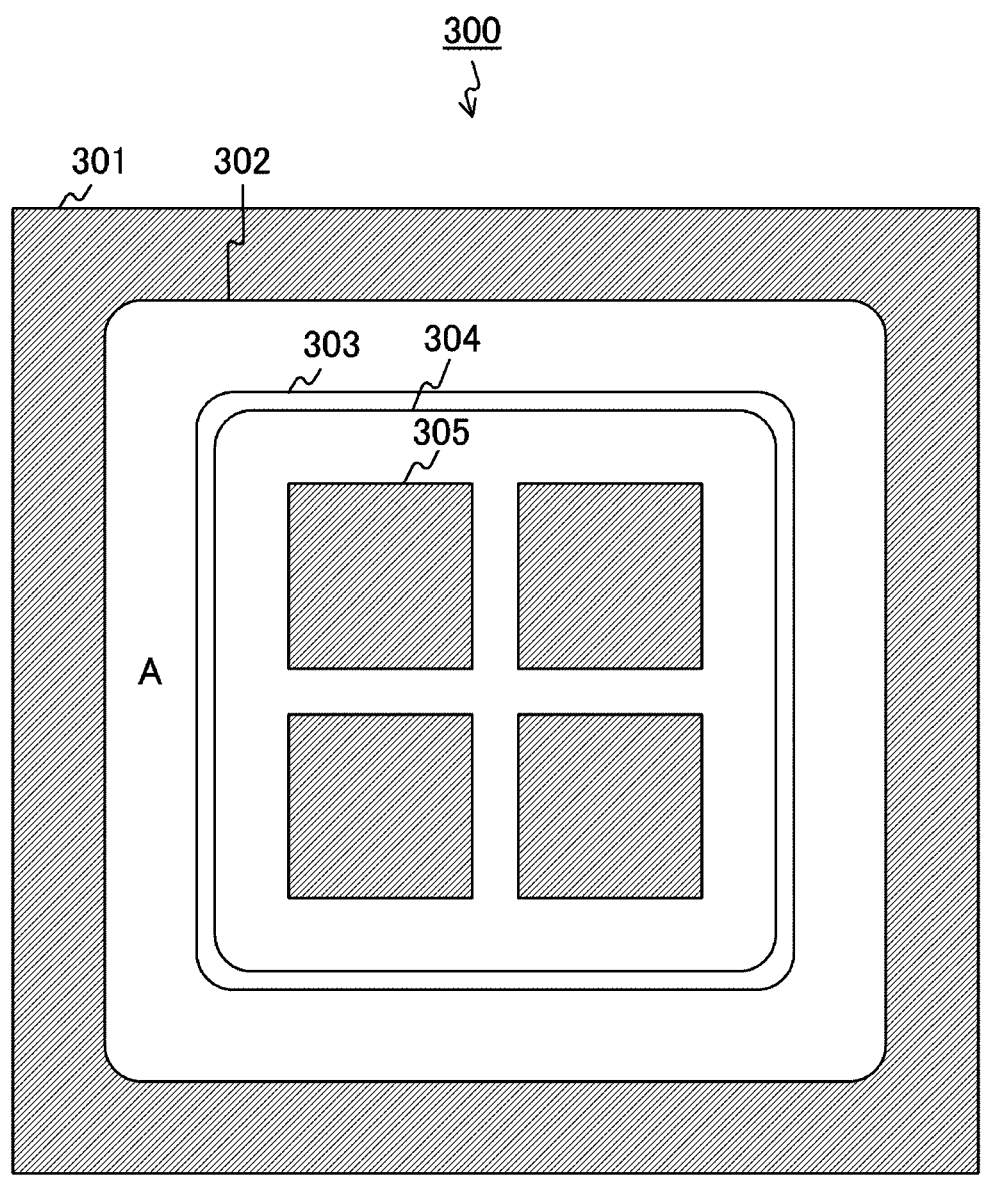
FIG. 12 is an example of a plan view of the photodiode in which the number of trenches is increased according to the third modification example of the first embodiment of the present technology.

Furthermore, the number of the trench 305 is not limited to one, and may be two or greater. For example, as illustrated in FIG. 12, four trenches 305 may be arranged in a two-dimensional lattice shape (or matrix). In a case of arranging a plurality of the trenches 305, it is preferable that on the substrate front surface, the density of the trenches 305 increases as it goes toward the center (that is, the density decreases as it is spaced away from the center).

As described above, according to the third modification example of the first embodiment, the rectangular trench 305 is formed, and thus it is possible to further reduce a defect in comparison to a case where the trench 305 is formed in a linear shape.

2. Second Embodiment

In the first embodiment, the n-layer 304 is exposed to the substrate front surface. However, in this configuration, there is a concern that a defect may occur in the n-layer 304 during processing and the like. A photodiode 300 of a second embodiment is different from the first embodiment in that the n-layer 304 is buried at the inside of the semiconductor substrate 303.

Figure 13:
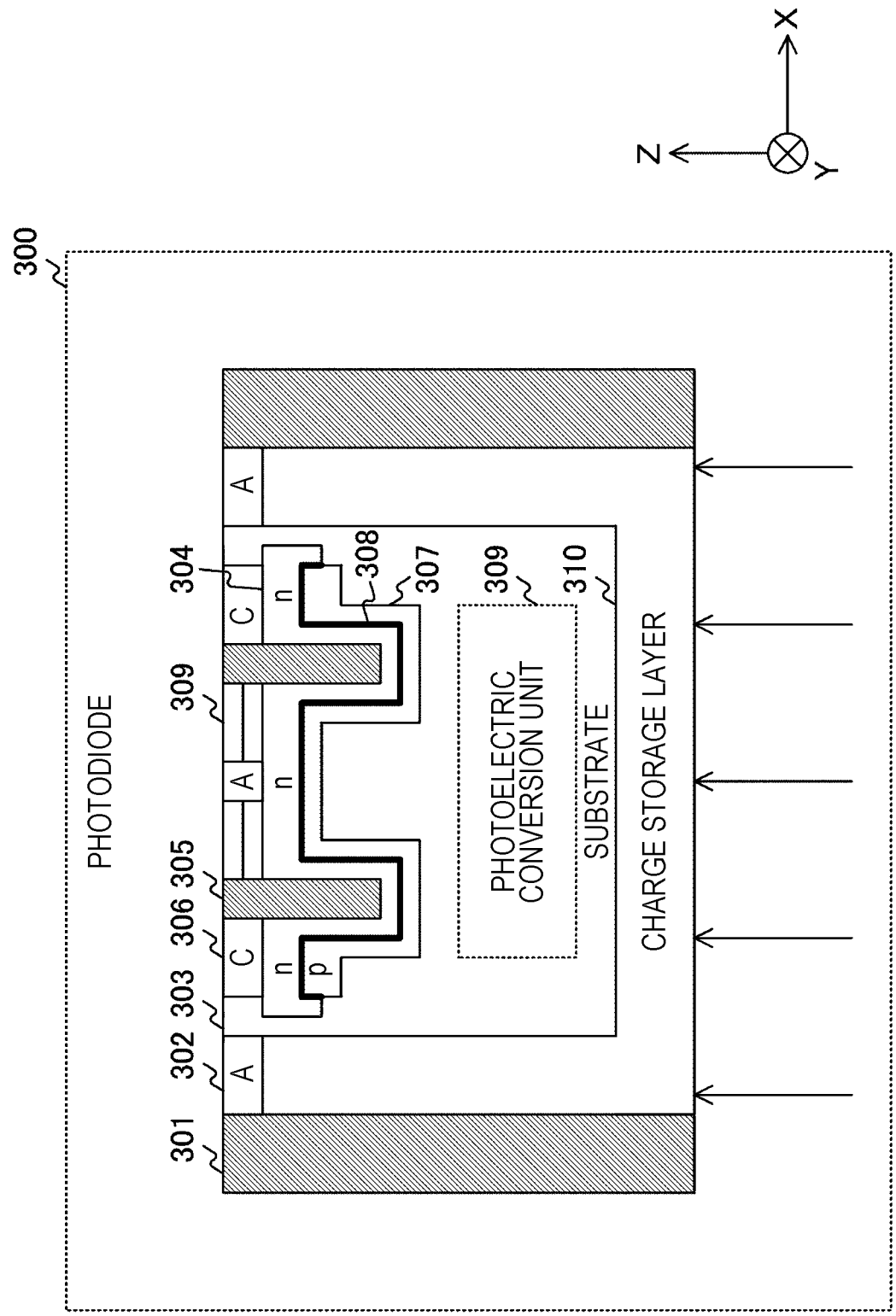
FIG. 13 is an example of a cross-sectional view of a photodiode according to a second embodiment of the present technology.

FIG. 13 is an example of a cross-sectional view of the photodiode 300 according to the second embodiment of the present technology. The photodiode 300 of the second embodiment is different from the first embodiment in that the n-layer 304 is not exposed to the substrate front surface, and is buried at the inside of the semiconductor substrate 303. The cathode 306 and the anode 302 are formed on an upper side of the n-layer 304. Furthermore, in the second embodiment, as in the second and third modification examples of the first embodiment, the shape of the trench 305 may be set to a linear shape or a rectangular shape.

As described above, in the second embodiment of the present technology, since the n-layer 304 is buried at the inside of the semiconductor substrate 303, it is possible to suppress occurrence of a defect in the n-layer 304.

First Modification Example

In the second embodiment, the amplification region 308 is formed through a heat treatment, but there is a concern that an adverse effect such as deformation of the semiconductor substrate 303 may occur due to the heat treatment. A photodiode 300 of a first modification example of the second embodiment is different from the second embodiment in that the amplification region 308 is formed through ion implantation.

Figure 14:
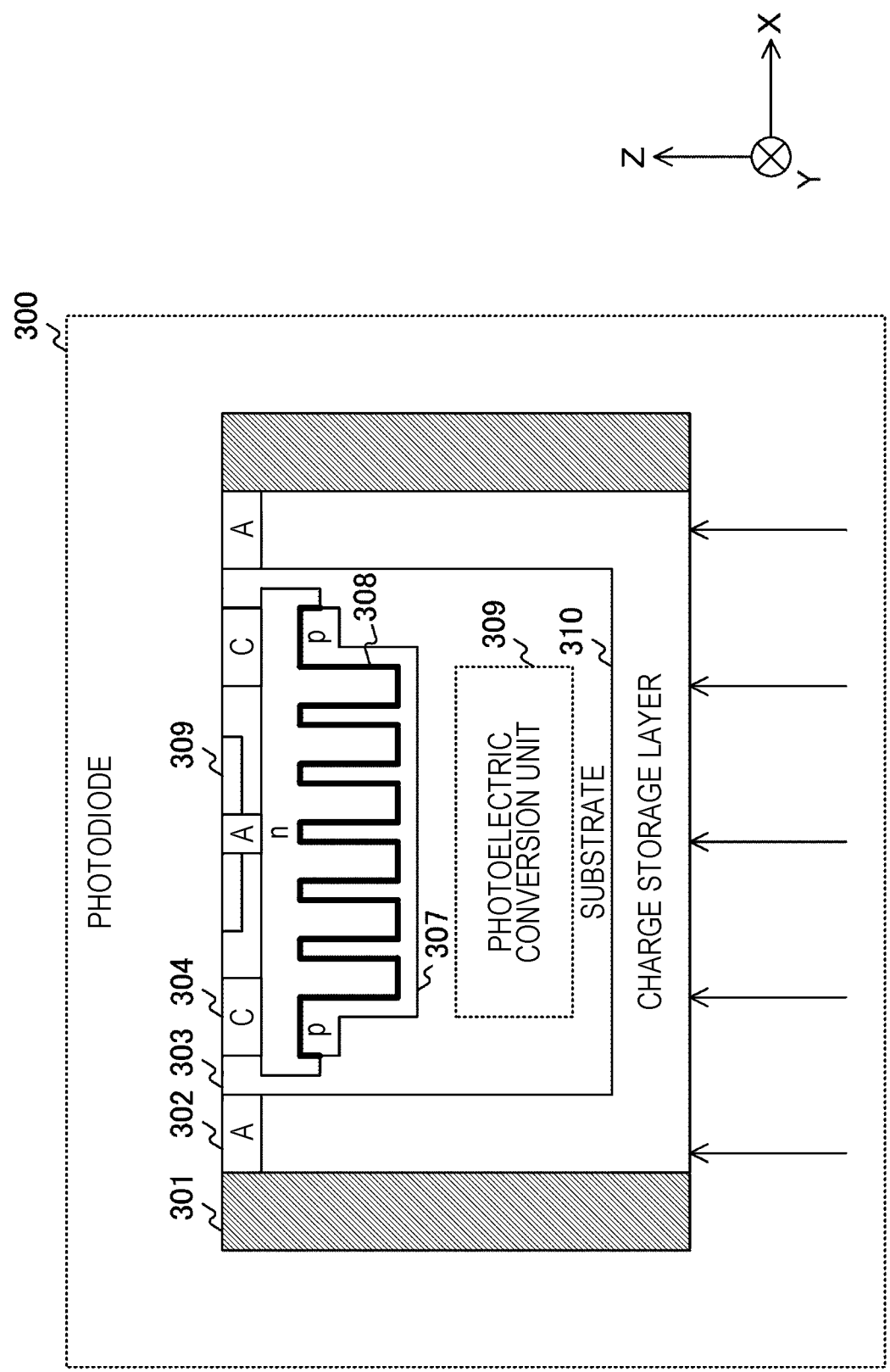
FIG. 14 is an example of a cross-sectional view of a photodiode according to a modification example of the second embodiment of the present technology.

FIG. 14 is an example of a cross-sectional view of the photodiode 300 according to the first modification example of the second embodiment of the present technology. In the first modification example of the second embodiment, a manufacturing system forms the amplification region 308 through ion implantation. According to this, even though the heat treatment is not performed after forming a trench, it is possible to form the amplification region 308 having a recess portion. Furthermore, in the second embodiment, as in the second and third modification examples of the first embodiment, the shape of the trench 305 may be set to a linear shape or a rectangular shape.

As described above, in the first modification example of the second embodiment of the present technology, the amplification region 308 is formed through ion implantation, and thus it is possible to manufacture the photodiode 300 without performing a heat treatment.

3. Third Embodiment

In the first embodiment, all circuits in the solid-state imaging element 200 are disposed in a single semiconductor chip, but there is a concern that a circuit size or a mounting area of the circuits increases along with an increase in the number of pixels. A solid-state imaging element 200 of the third embodiment is different from the first embodiment in that circuits are disposed to be dispersed to two semiconductor chips which are stacked.

Figure 15:
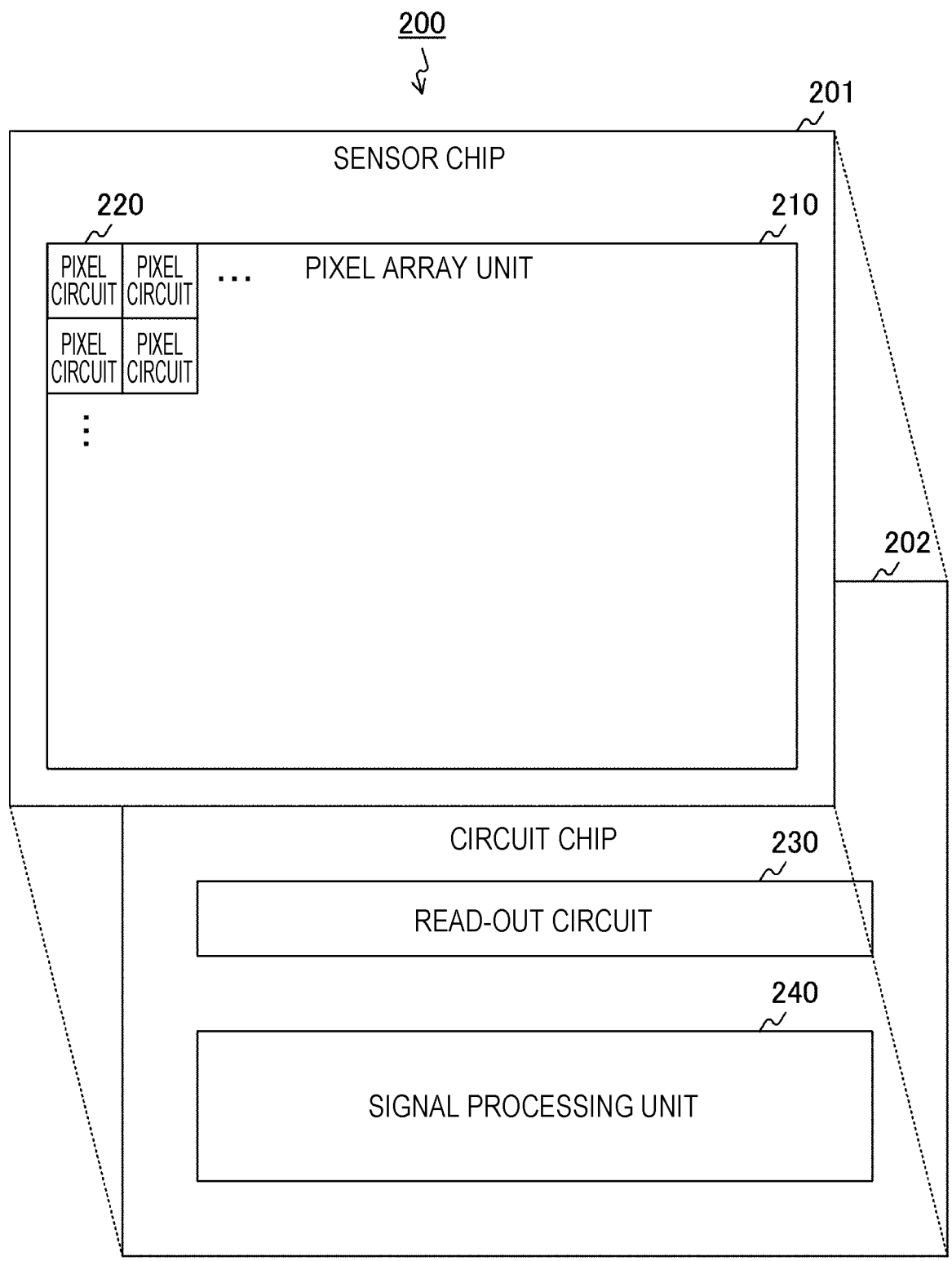
FIG. 15 is a block diagram illustrating a configuration example of a solid-state imaging element according to the third embodiment of the present technology.

FIG. 15 is a block diagram illustrating a configuration example of the solid-state imaging element 200 according to the third embodiment of the present technology. The solid-state imaging element 200 includes a sensor chip 201, and a circuit chip 202 that is stacked on the sensor chip 201.

The pixel array unit 210 is disposed in the sensor chip 201. In addition, the read-out circuit 230 and a signal processing unit 240 are disposed in the circuit chip 202. The signal processing unit 240 has a similar configuration as that of the signal processing units 241 and 242 of the first embodiment.

Figure 16:
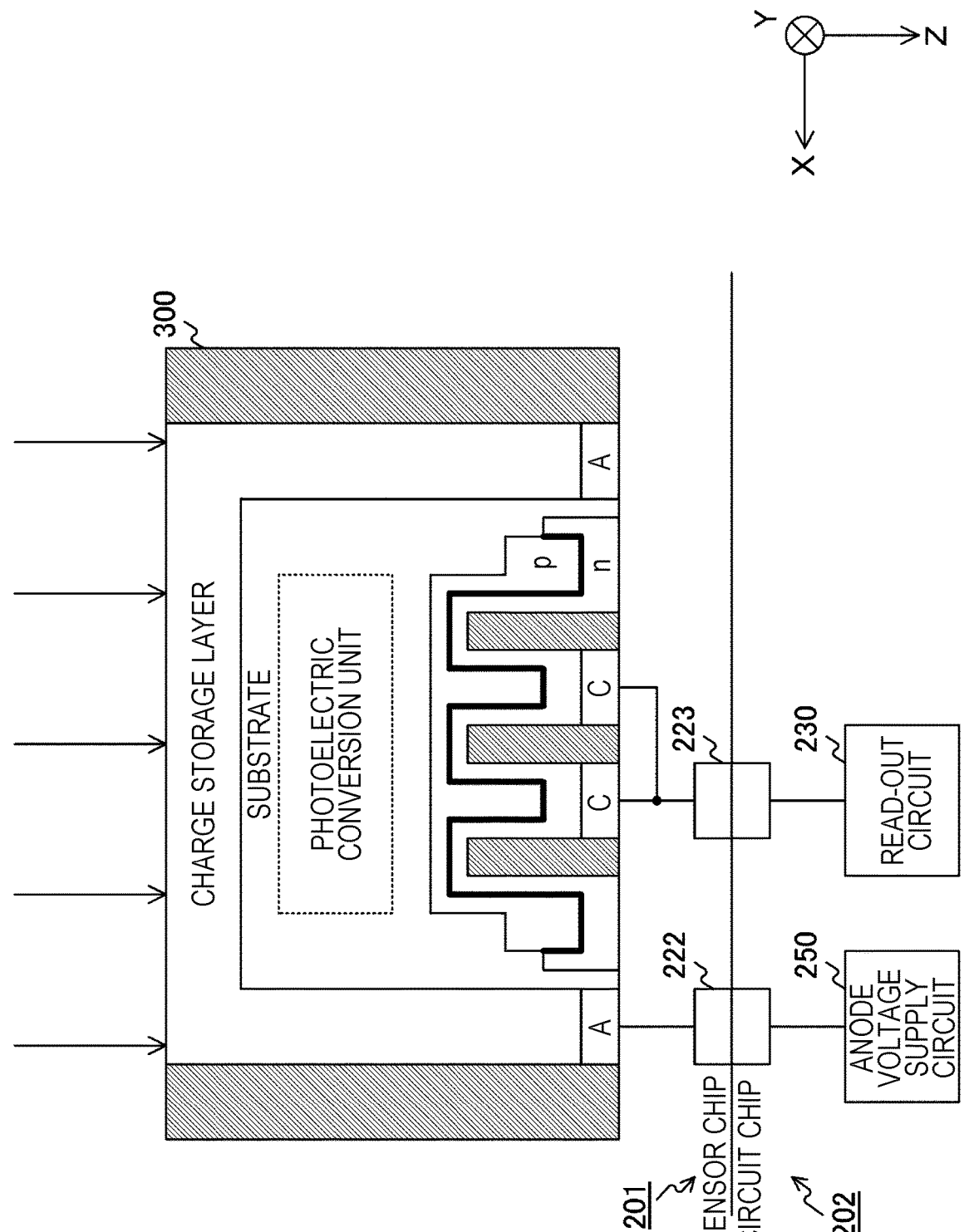
FIG. 16 is a view illustrating a stacking structure of the solid-state imaging element according to the third embodiment of the present technology.

FIG. 16 is a view illustrating a stacking structure of the solid-state imaging element 200 according to the third embodiment of the present technology. The sensor chip 201 and the circuit chip 202 are joined to each other at joining portions 222 and 223 by CuCu joining or the like. An anode of the photodiode 300 is connected to an anode voltage supply circuit 250 in the circuit chip 202 through the joining portion 222. In addition, a cathode of the photodiode 300 is connected to the read-out circuit 230 in the circuit chip 202 through the joining portion 223.

As described above, according to the third embodiment of the present technology, circuits in the solid-state imaging element 200 are disposed to be dispersed to the sensor chip 201 and the circuit chip 202, and thus it is possible to reduce a circuit size and a mounting area per chip.

4. Fourth Embodiment

In the first embodiment, the photoelectric conversion unit 309 performs photoelectric conversion. However, there is a concern that it is difficult to perform photoelectric conversion with respect to the entirety of light beams, and particularly, conversion efficiency of the photoelectric conversion unit 309 deceases when a wavelength of light is long, and thus light may be transmitted through a pixel. A solid-state imaging element 200 of a fourth embodiment is different form the first embodiment in that a reflecting plate is disposed on a lower side of the photodiode 300.

Figure 17:
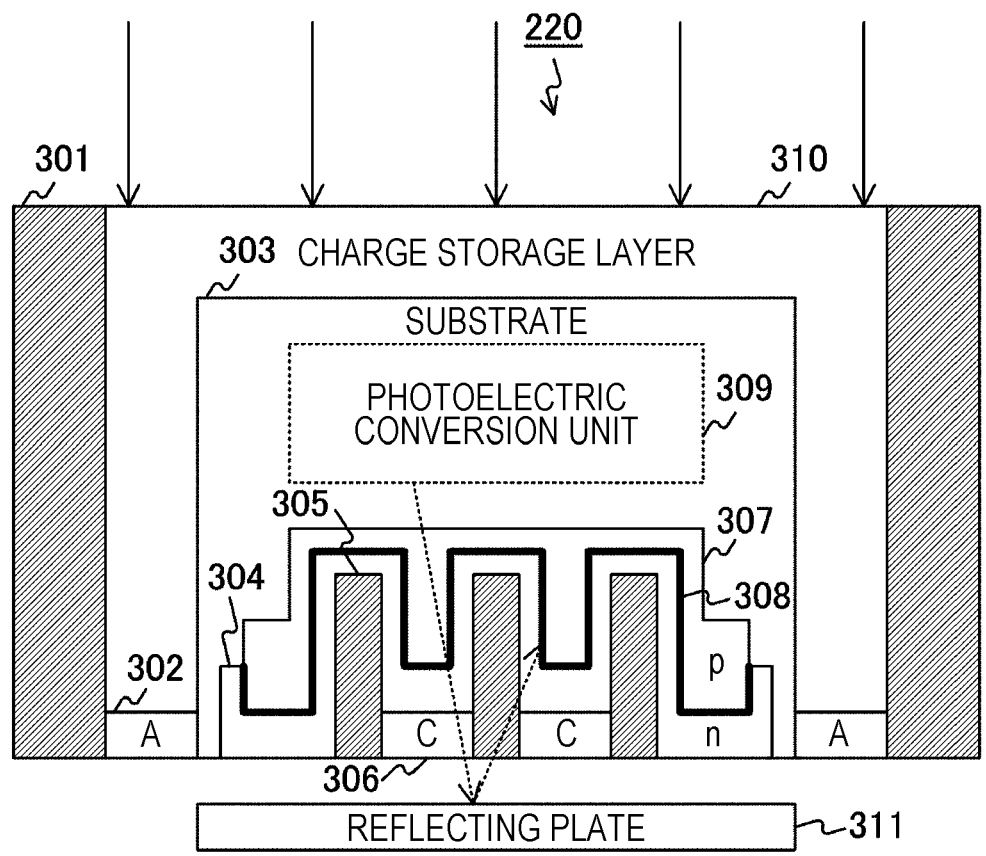
FIG. 17 is an example of a cross-sectional view of a pixel circuit according to a fourth embodiment of the present technology.

FIG. 17 is an example of a cross-sectional view of a pixel circuit 220 according to the fourth embodiment of the present technology. The pixel circuit 220 is different from the first embodiment in that a reflecting plate 311 is further provided.

The reflecting plate 311 is disposed on a lower side of the substrate front surface of the photodiode 300, and reflects light transmitted through the photodiode 300. The reflected light is photoelectrically converted again by the photodiode 300, and thus it is possible to improve conversion efficiency. As the reflecting plate 311, for example, a plate including a metal such as aluminum can be used.

As described above, according to the fourth embodiment of the present technology, light transmitted through the photodiode 300 is reflected by the reflecting plate 311, and thus it is possible to further improve conversion efficiency of photoelectric conversion in comparison to a case where the reflecting plate 311 is not provided.

5. Fifth Embodiment

In the first embodiment, the plurality of pixel circuits 220 are arranged in a two-dimensional lattice shape. However, there is a concern that light leaked from an adjacent pixel circuit 220 (so-called stray light) may be incident to each of the pixel circuits 220, and color-mixing may occur. The pixel circuit 220 of the fifth embodiment is different from the first embodiment in that a light-shielding wall that shields the stray light is provided between pixels.

FIG. 18 is an example of a cross-sectional view of the pixel circuit 220 according to the fifth embodiment of the present technology. The pixel circuit 220 of the fifth embodiment is different from the first embodiment in that a light-shielding wall 312 and an aperture ratio adjustment metal 313 are further provided.

The light-shielding wall 312 shields stray light. For example, the light-shielding wall 312 is formed by providing a trench that extends in the Z direction between pixels, and by burying a metal in the trench.

The aperture ratio adjustment metal 313 shields a part of incident light and adjusts an aperture ratio. The aperture ratio adjustment metal 313 is provided on the rear surface of the semiconductor substrate 303 at a position of the light-shielding wall 312.

As described above, according to the fifth embodiment of the present technology, since the light-shielding wall 312 that shields stray light is disposed, it is possible to prevent (or alternatively, reduce) color-mixing.

6. Sixth Embodiment

In the first embodiment, in the pixel circuit 220, the photodiode 300 performs photoelectric conversion of light, but there is a concern that when a wavelength of light is long, conversion efficiency of the photoelectric conversion unit 309 decreases. A pixel circuit 220 of a sixth embodiment is different from the first embodiment in that an on-chip lens 314 that condenses light is further provided.

FIG. 19 is an example of a cross-sectional view of a pixel circuit 220 according to the sixth embodiment of the present technology. The pixel circuit 220 is different from the first embodiment in that the on-chip lens 314 is further provided.

The on-chip lens 314 condenses incident light and guides the light to the photodiode 300. The on-chip lens 314 is disposed on the rear surface of the semiconductor substrate 303.

As described above, according to the sixth embodiment of the present technology, since the on-chip lens 314 that condenses incident light is provided, it is possible to further improve conversion efficiency of photoelectric conversion in comparison to a case where the on-chip lens 314 is not provided.

7. Seventh Embodiment

In the sixth embodiment, the plurality of pixel circuits 220 are arranged in a two-dimensional lattice shape. However, there is a concern that light leaked from an adjacent pixel circuit 220 may be incident to each of the pixel circuits 220, and color-mixing may occur. In addition, when a wavelength of light is long, there is a concern that conversion efficiency of the photoelectric conversion unit 309 decreases. A pixel circuit 220 of a seventh embodiment is different from the sixth embodiment in that a light-shielding wall and a reflecting plate are disposed.

FIG. 20 is an example of a cross-sectional view of a pixel circuit 220 according to the seventh embodiment of the present technology. The pixel circuit 220 of the seventh embodiment is different form the sixth embodiment in that a reflecting plate 311, a light-shielding wall 312, and an aperture ratio adjustment metal 313 are further provided. A configuration and arrangement of the reflecting plate 311, the light-shielding wall 312, and the aperture ratio adjustment metal 313 are similar to those in the fourth and fifth embodiments.

As described above, according to the seventh embodiment of the present technology, since the light-shielding wall 312 that shields stray light is further disposed, it is possible to prevent (or alternatively, reduce) color-mixing. In addition, light transmitted through the photodiode 300 is reflected by the reflecting plate 311, and thus it is possible to improve conversion efficiency of photoelectric conversion.

8. Eighth Embodiment

In the first embodiment, the solid-state imaging element 200 is disposed in the distance measurement module 100, but may be disposed in an imaging device. A solid-state imaging element 200 of an eighth embodiment is different from the first embodiment in that the solid-state imaging element 200 is disposed in the imaging device.

Figure 21:
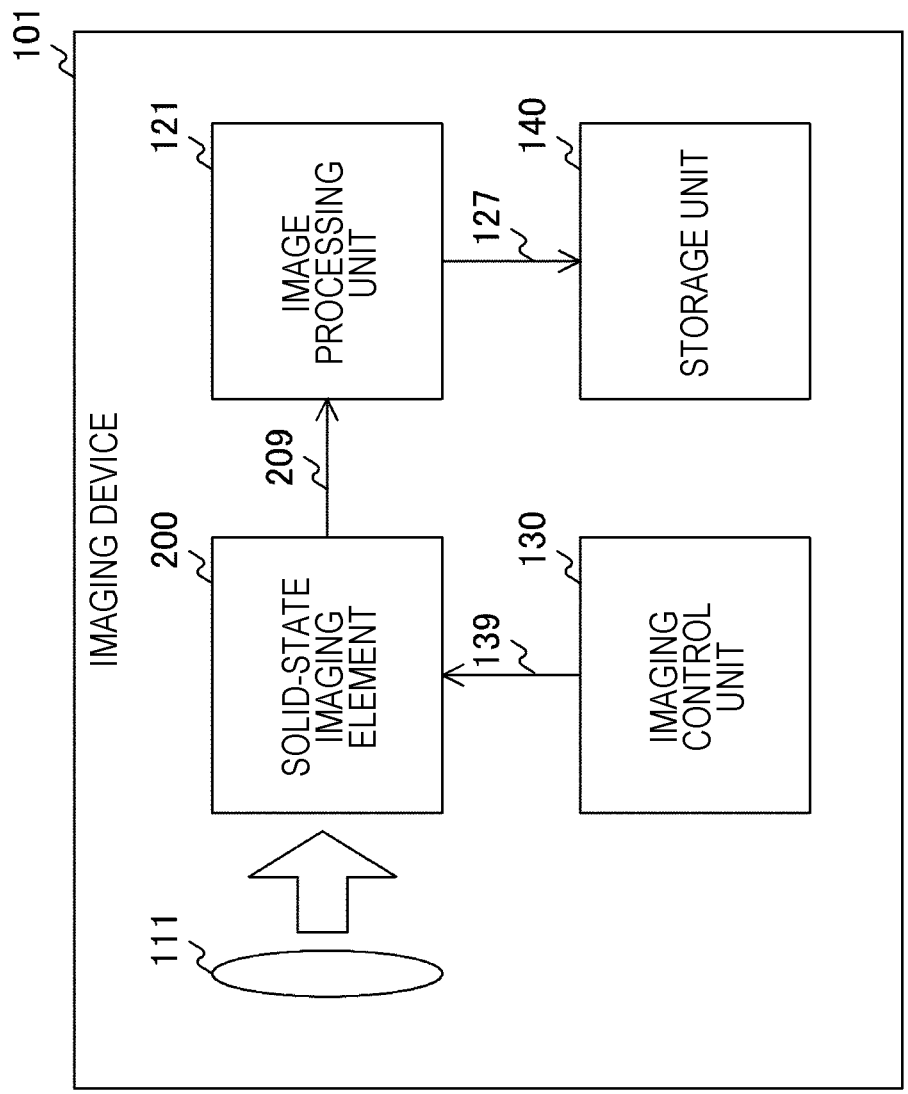
FIG. 21 is a block diagram illustrating a configuration example of an imaging device according to an eighth embodiment of the present technology.

FIG. 21 is a block diagram illustrating a configuration example of an imaging device 101 according to the eighth embodiment of the present technology. The imaging device 101 is a device that images image data, and includes an imaging lens 111, a solid-state imaging element 200, an image processing unit 121, an imaging control unit 130, and a recording unit 140. As the imaging device 101, a digital camera, a smartphone, a personal computer, and the like are assumed. Furthermore, the imaging device 101 is an example of an electronic apparatus described in the appended claims.

The imaging lens 111 condenses light from a subject and guides the light to the solid-state imaging element 200.

The solid-state imaging element 200 images image data in accordance with a control of the imaging control unit 130. Signal processing units 241 and 242 in the solid-state imaging element 200 count the number of pulses of pulse signals from the pixel circuit 220, for example, by using a counter, and supplies the count value to the image processing unit 121 as pixel data through a signal line 209.

The imaging control unit 130 controls the solid-state imaging element 200 by supplying a vertical synchronization signal and the like through a signal line 139. The image processing unit 121 executes various kinds of image processing with respect to the image data. The image processing unit 121 supplies image data after processing to the recording unit 140 through a signal line 127. The recording unit 140 records the image data.

9. Application Example to Moving Body

The technology (the present technology) according to the present disclosure is applicable to various products. For example, the technology according to the present disclosure can be realized as a device that is mounted on a moving body any one kind among an automobile, an electric vehicle, a hybrid electric vehicle, a motorcycle, a bicycle, a personal mobility, an airplane, a drone, a ship, a robot, and the like.

Figure 22:
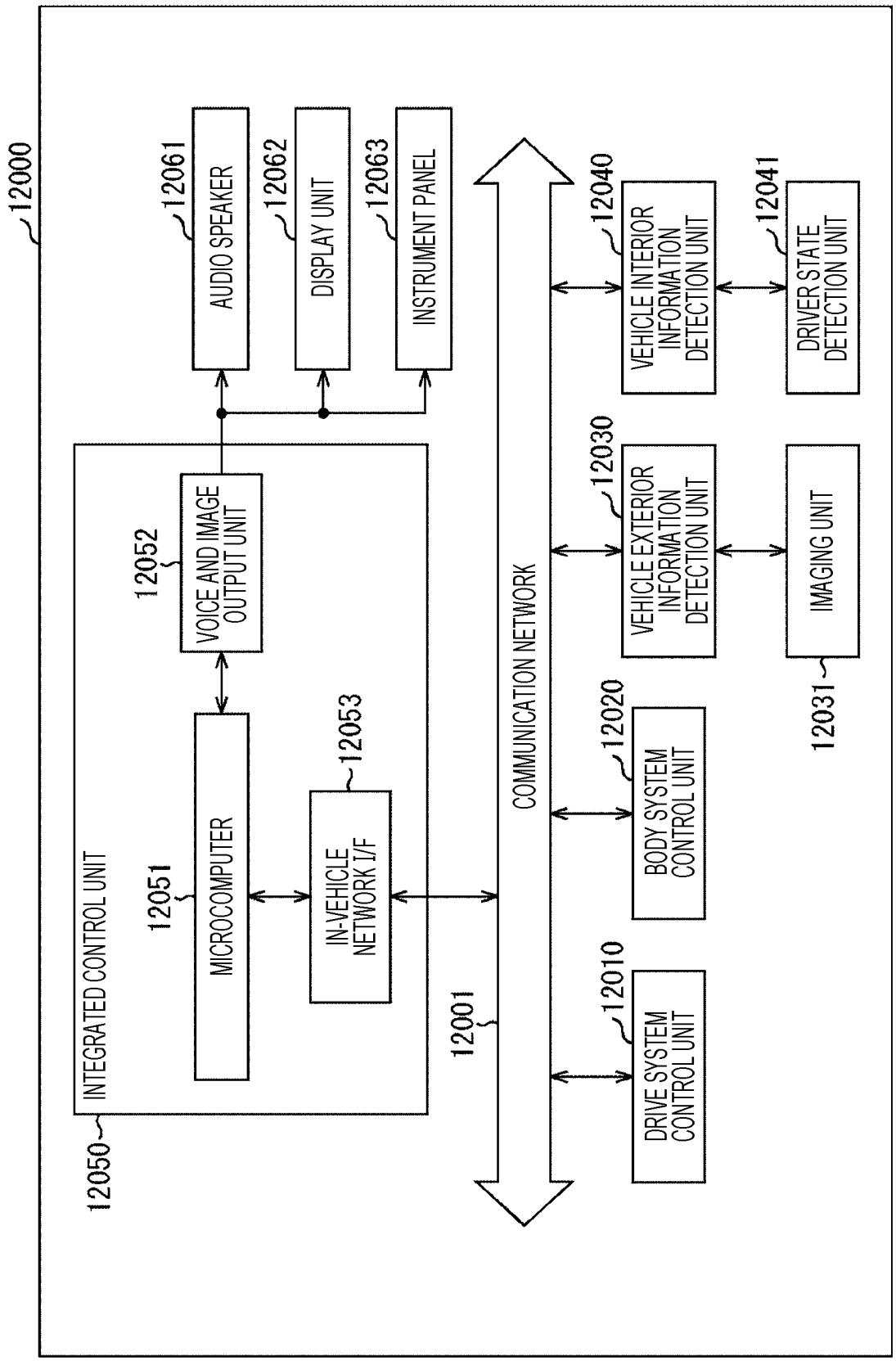
FIG. 22 is a block diagram illustrating a schematic configuration example of a vehicle control system.

FIG. 22 is a block diagram illustrating a schematic configuration example of a vehicle control system that is an example of a moving body control system to which the technology according to the present disclosure is applicable.

A vehicle control system 12000 includes a plurality of electronic control units which are connected to each other through a communication network 12001. In the example illustrated in FIG. 22, the vehicle control system 12000 includes a drive system control unit 12010, a body system control unit 12020, a vehicle exterior information detection unit 12030, a vehicle interior information detection unit 12040, and an integrated control unit 12050. In addition, as a functional configuration of the integrated control unit 12050, a microcomputer 12051, a voice and image output unit 12052, and an invehicle network interface (I/F) 12053 are illustrated in the drawing.

The drive system control unit 12010 controls an operation of a device relating to the drive system of the vehicle in accordance with various programs. For example, the drive system control unit 12010 functions as a control device of a drive force generation device such as an internal combustion engine and a drive motor which generate a drive force of the vehicle, a drive force transmission mechanism that transmits the drive force to wheels, a steering mechanism that adjusts a steering angle of the vehicle, and a braking device that generates a braking force of the vehicle, and the like.

The body system control unit 12020 controls an operation of various devices which are mounted to a vehicle body in accordance with various programs. For example, the body system control unit 12020 functions as a control device of a keyless entry system, a smart key system, a power window device, and various lamps such as a head lamp, a back lamp, a brake lamp, a winker, and a fog lamp. In this case, an electric wave that is transmitted from a portable device that substitutes for a key, or signals of various switches can be input to the body system control unit 12020. The body system control unit 12020 receives input of the electric wave or the signals, and controls a door lock device, a power window device, a lamp, and the like of the vehicle.

The vehicle exterior information detection unit 12030 detects information on an outer side of the vehicle on which the vehicle control system 12000 is mounted. For example, an imaging unit 12031 is connected to the vehicle exterior information detection unit 12030. The vehicle exterior information detection unit 12030 allows the imaging unit 12031 to capture a vehicle exterior image, and receives the captured image. The vehicle exterior information detection unit 12030 may perform object detection processing of a person, a vehicle, an obstacle, a sign, a character on a road, or the like, or distance detection processing on the basis of the image that is received.

The imaging unit 12031 is an optical sensor that receives light and outputs an electric signal corresponding to the amount of light received. The imaging unit 12031 can output the electric signal as an image or as distance measurement information. In addition, light received by the imaging unit 12031 may be visible light, or invisible light such as infrared rays.

The vehicle interior information detection unit 12040 detects vehicle interior information. For example, a driver state detection unit 12041 that detects a driver state is connected to the vehicle interior information detection unit 12040. For example, the driver state detection unit 12041 includes a camera that images a driver, and the vehicle interior information detection unit 12040 may calculate the degree of fatigue or the degree of concentration of a driver, or may determine whether or not the driver drowses on the basis of detection information that is input from the driver state detection unit 12041.

The microcomputer 12051 calculates a control target value of the drive force generation device, the steering mechanism, or the braking device on the basis of vehicle interior or exterior information that is acquired by the vehicle exterior information detection unit 12030 or the vehicle interior information detection unit 12040, and can output a control command to the drive system control unit 12010. For example, the microcomputer 12051 can perform a cooperative control to realize a function of an advanced driver assistance system (ADAS) which includes collision avoidance or impact mitigation of the vehicle, following travel based on an intervehicle distance, vehicle speed maintenance travel, vehicle collision alarm, vehicle lane deviation alarm, and the like.

In addition, the microcomputer 12051 can perform a cooperative control for automatic driving and the like in which the vehicle autonomously travels without depending on an operation of a driver by controlling the drive force generation device, the steering mechanism, the braking device, and the like on the basis of information in the vicinity of the vehicle which is acquired by the vehicle exterior information detection unit 12030 or the vehicle interior information detection unit 12040.

In addition, the microcomputer 12051 can output a control command to the body system control unit 12020 on the basis of the vehicle exterior information acquired by the vehicle exterior information detection unit 12030. For example, the microcomputer 12051 can perform a cooperative control to realize glare protection such as switching of a high beam into a low beam by controlling the head lamp in correspondence with a position of a preceding vehicle or an oncoming vehicle which is detected by the vehicle exterior information detection unit 12030.

The voice and image output unit 12052 transmits at least one output signal between a voice and an image to an output device capable of visually or aurally notifying a passenger in a vehicle or an outer side of the vehicle of information. In the example in FIG. 22, as the output device, an audio speaker 12061, a display unit 12062, and an instrument panel 12063 are exemplified. For example, the display unit 12062 may include at least one of an on-board display and a head-up display.

Figure 23:
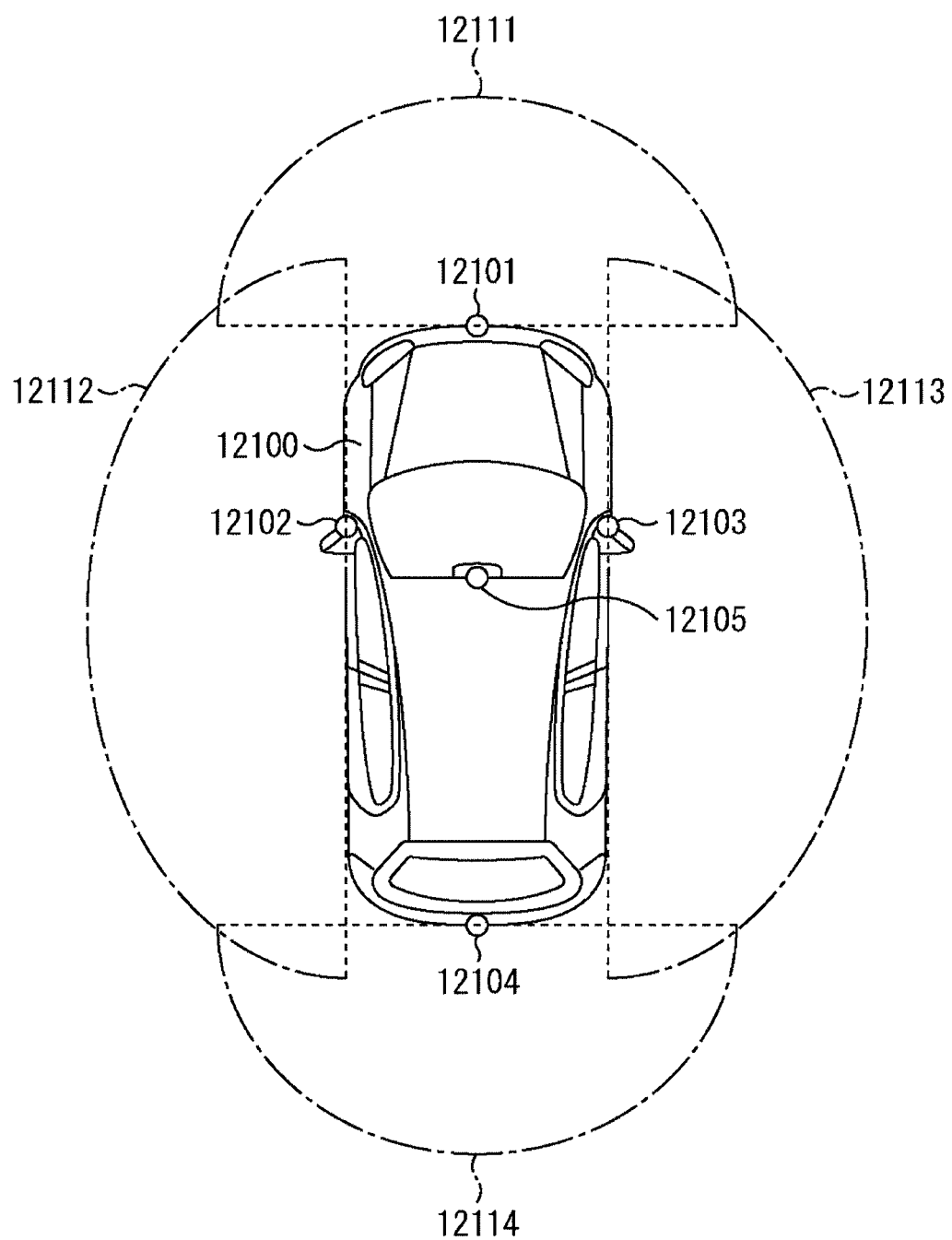
FIG. 23 is a view illustrating an example of an installation position of an imaging unit.

FIG. 23 is a view illustrating an example of an installation position of the imaging unit 12031.

In FIG. 23, as the imaging unit 12031, imaging units 12101, 12102, 12103, 12104, and 12105 are provided.

For example, the imaging units 12101, 12102, 12103, 12104, and 12105 are installed at positions such as a front nose, a side-view mirror, a rear bumper, a back door, an upper side of a vehicle front glass in a vehicle room, of the vehicle 12100. The imaging unit 12101 provided at the front nose, and the imaging unit 12105 that is provided on an upper side of the vehicle front glass in a vehicle room mainly acquire images on a forward side of the vehicle 12100. The imaging units 12102 and 12103 which are provided in the side-view mirror mainly acquire images on a lateral side of the vehicle 12100. The imaging unit 12104 that is provided in the rear bumper or the back door mainly acquires images on a backward side of the vehicle 12100. The imaging unit 12105 that is provided on an upper side of the vehicle front glass in the vehicle room can be mainly used to detect a preceding vehicle, a pedestrian, an obstacle, a traffic signal, a traffic sign, a vehicle lane, and the like.

Furthermore, FIG. 23 illustrates an example of a photographing range of the imaging units 12101 to 12104. An image capturing range 12111 represents an image capturing range of the imaging unit 12101 that is provided in the front nose, image capturing ranges 12112 and 12113 respectively represent image capturing ranges of the imaging units 12102 and 12103 which are provided in the side-view mirrors, an image capturing range 12114 represents an image capturing range of the imaging unit 12104 that is provided in the rear bumper or the back door. For example, when a plurality of pieces of image data captured by the imaging unit 12101 to 12104 are superimposed on each other, it is possible to obtain an overlooking image when the vehicle 12100 is viewed from an upper side.

At least one of the imaging units 12101 to 12104 may have a function of acquiring distance information. For example, at least one of the imaging units 12101 to 12104 may be a stereo camera including a plurality of imaging elements, or may be an imaging element that includes pixels for phase difference detection.

For example, the microcomputer 12051 can extract a three-dimensional object, which is a closest three-dimensional object, particularly, on a proceeding path of the vehicle 12100 and travels in approximately the same direction as that of the vehicle 12100 that travels at a predetermined velocity (for example, 0 km/h or greater), as a preceding vehicle by obtaining distances to respective three-dimensional objects in the image capturing ranges 12111 to 12114 and a variation of the distances with the passage of time (relative velocity to the vehicle 12100) on the basis of the distance information obtained from the imaging units 12101 to 12104. In addition, the microcomputer 12051 can set a distance between vehicles to be secured in advance in front of the preceding vehicle to perform automatic brake control (also including a following stop control), an automatic acceleration control (also including a following acceleration control), and the like. As described above, it is possible to perform a cooperative control for automatic driving in which a vehicle autonomously travels without depending on an operation by a driver, and the like.

For example, the microcomputer 12051 can extract three-dimensional object data relating to a three-dimensional object by classifying a plurality of pieces of the three-dimensional object data into data of a two-wheel vehicle, data of typical vehicle, data of a large-sized vehicle, data of pedestrian, and data of other three-dimensional objects such as an electric pole on the basis of the distance information obtained from the imaging units 12101 to 12104, and can use the three-dimensional object data for automatic obstacle avoidance. For example, the microcomputer 12051 discriminates obstacles at the periphery of the vehicle 12100 into an obstacle that is visually recognized by a driver of the vehicle 12100 and an obstacle that is difficult to be visually recognized by the driver. In addition, the microcomputer 12051 determines collision risk indicating the degree of danger of collision with each of the obstacles. In a situation in which the collision risk is equal to or greater than a set value, and collision may occur, the microcomputer 12051 can assist driving for collision avoidance by outputting an alarm to the driver through the audio speaker 12061 or the display unit 12062, or by performing compulsory deceleration or avoidance steering through the drive system control unit 12010.

At least one of the imaging units 12101 to 12104 may be an infrared camera that detects infrared rays. For example, the microcomputer 12051 can recognize a pedestrian by determining whether or not the pedestrian exists in image captured by the imaging units 12101 to 12104. For example, the pedestrian recognition is performed by a procedure of extracting a specific point in images captured by the imaging units 12101 to 12104 as an infrared camera, and a procedure of performing pattern matching processing for a series of specific points indicating a contour line of an object to determine whether or not the object is a pedestrian. When the microcomputer 12051 determines that a pedestrian exists on the images captured by the imaging units 12101 to 12104, and recognizes the pedestrian, the voice and image output unit 12052 controls the display unit 12062 to overlap and display a quadrangular contour line for emphasis on the pedestrian who is recognized. In addition, the voice and image output unit 12052 may control the display unit 12062 to display an icon and the like indicating the pedestrian at a desired position.

Hereinbefore, description has been given of an example of the vehicle control system to which the present technology relating to the present disclosure is applicable. The technology relating to the present disclosure is applicable to the imaging unit 12031 among the above-described configurations, for example. Specifically, it is possible to apply the imaging device 101 exemplified in FIG. 21 to the imaging unit 12031. When applying the technology relating to the present disclosure to the imaging unit 12031, it is possible to increase sensitivity and photoelectric conversion efficiency, and it is possible to obtain a captured image that is easier to view. As a result, it is possible to reduce fatigue of a driver.

Furthermore, the above-described embodiments illustrate an example for embodiment of the present technology, and matters in the embodiments and invention-specific matters in the appended claims have a corresponding relationship. Similarly, the invention-specific matters in the appended claims and matters in the embodiment of the present technology to which the same term is given have a corresponding relationship. However, the present technology is not limited to the embodiments and can be embodied by making various modifications in the embodiments in a range not departing from the gist.

Furthermore, the effects described in this specification are illustrative only and are not limited thereto, and other effects may exist.

Furthermore, the present technology can have the following configurations.

(1) A photodiode including:
a photoelectric conversion unit that converts incident light into a charge;
an amplification region in which a recess portion is formed and which amplifies the charge; and
an electrode from which the amplified charge is output.

(2) The photodiode according to (1),
in which the photoelectric conversion unit is formed in a predetermined semiconductor substrate, and
the recess portion is a portion that is recessed in a direction perpendicular to a substrate plane of the predetermined semiconductor substrate.

(3) The photodiode according to (2),
in which the recess portion is formed in a predetermined plane parallel to the substrate plane in a mesh shape.

(4) The photodiode according to (2),
in which the recess portion is formed in a predetermined plane parallel to the substrate plane in a linear shape.

(5) The photodiode according to (2),
in which a shape of the recess portion is a rectangular shape when viewed from a predetermined plane parallel to the substrate plane.

(6) The photodiode according to (2), further including:
a trench that is formed in the substrate plane, in which the recess portion is formed along the trench.

(7) The photodiode according to any one of (1) to (6), further including:
an n-layer that includes n-type impurities; and
a p-layer that includes p-type impurities,
in which the amplification region is formed at an interface between the n-layer and the p-layer.

(8) The photodiode according to (7),
in which the n-layer is buried in a predetermined semiconductor substrate.

(9) The photodiode according to (7) or (8),
in which the predetermined semiconductor substrate includes impurities having an impurity concentration that is lower than an impurity concentration of the n-layer and the p-layer.

(10) The photodiode according to (9),
in which the impurities included in the predetermined semiconductor substrate are n-type impurities.

(11) The photodiode according to (9),
in which the impurities included in the predetermined semiconductor substrate are p-type impurities.

(12) The photodiode according to any one of (1) to (11),
in which the amplification region performs avalanche amplification with respect to the charge.

(13) A pixel circuit including:
a photoelectric conversion unit that converts incident light into a charge;
an amplification region in which a recess portion is formed and which amplifies the charge;
an electrode from which the amplified charge is output; and
a resistor that is connected to the electrode.
(14) The pixel circuit according to (13), further including:
a reflecting plate that reflects the incident light that is transmitted through the photoelectric conversion unit and the amplification region.
(15) The pixel circuit according to (13) or (14), further including:
a light-shielding wall that shields stray light from an adjacent pixel.
(16) The pixel circuit according to any one of (13) to (15), including:
an on-chip lens that condenses the incident light and guides the incident light to the photoelectric conversion unit.
(17) An electronic apparatus including:
a photoelectric conversion unit that converts incident light into a charge;
an amplification region in which a recess portion is formed and which amplifies the charge;
an electrode from which the amplified charge is output; and
a read-out circuit that reads out a signal including the output charge.
(18) The electronic apparatus according to (17),
in which the photoelectric conversion unit, the amplification region, and the electrode are disposed in a predetermined sensor chip, and
the read-out circuit is disposed in a circuit chip that is stacked on the predetermined sensor chip.
(19) A method of manufacturing a photodiode, the method including:
an amplification region forming procedure of forming an amplification region in which a recess portion is provided in a predetermined semiconductor substrate in which a photoelectric conversion unit that converts incident light into a charge is formed; and
an electrode disposing procedure of disposing an electrode, from which a charge amplified by the amplification region is output, in the predetermined semiconductor substrate.
(20) The method of manufacturing a photodiode according to (19),
in which the amplification region forming procedure includes:
a trench forming procedure of forming a trench in a substrate plane of the predetermined semiconductor substrate; and
a heat treatment procedure of forming the amplification region by performing filling the trench with predetermined impurities and performing a heat treatment.
(21) An avalanche photodiode (APD) sensor comprising:
a photoelectric conversion region disposed in a substrate and that converts light incident to a first side of the substrate into electric charge;
a cathode region disposed at a second side of the substrate, the second side being opposite the first side;
an anode region disposed at the second side of the substrate;
a first region of a first conductivity type disposed in the substrate; and a second region of a second conductivity type disposed in the substrate, the second conductivity type being different than the first conductivity type,
wherein, in a cross-sectional view, the first region and the second region are between the photoelectric conversion region and the second side of the substrate, and
wherein, in the cross-sectional view, an interface between the first region and the second region has an uneven pattern.
(22) The APD sensor of (21), wherein, in the cross sectional view, the uneven pattern is a comb pattern with a plurality of teeth.
(23) The APD sensor of one or more of (21) to (22), wherein, in the cross sectional view, the first region surrounds three sides of the cathode region.
(24) The APD sensor of one or more of (21) to (23), wherein, in a plan view, the anode region surrounds the first region, the second region, and the cathode region.
(25) The APD sensor of one or more of (21) to (24), further comprising:
at least one trench penetrating first region and the cathode region from the second side.
(26) The APD sensor of one or more of (21) to (25), wherein the at least one trench includes one of an oxide material or a semiconductor material having a different crystal structure than the substrate.
(27) The APD sensor of one or more of (21) to (26), wherein the at least one trench is filled with one of the oxide material or the semiconductor material having the different crystal structure than the substrate.
(28) The APD sensor of one or more of (21) to (27), wherein the at least one trench includes one of an oxide material, a semiconductor material, or a conductive material.
(29) The APD sensor of one or more of (21) to (28), wherein the at least one trench is filled with one of the oxide material, the semiconductor material, or the conductive material.
(30) The APD sensor of one or more of (21) to (29), wherein the oxide material includes one of silicon oxide or hafnium oxide, wherein the semiconductor material includes silicon having a different crystal structure than the substrate, and wherein the conductive material includes one of tungsten or copper.
(31) The APD sensor of one or more of (21) to (30), wherein the at least one trench includes a plurality of trenches, and wherein, in a plan view, the plurality of trenches form one of a plurality of linear shapes, a plurality of shapes arranged in a matrix, or a mesh shape.
(32) The APD sensor of one or more of (21) to (31), wherein, in the cross sectional view, at least one of the plurality of trenches includes a portion that extends into the first region so as to be between sections of the uneven pattern of the interface.
(33) The APD sensor of one or more of (21) to (32), further comprising:
a pixel isolation layer formed in the substrate to isolate the photoelectric conversion region from an adjacent photoelectric conversion region.
(34) An avalanche photodiode sensor (APD) sensor, comprising:
a photoelectric conversion region disposed in a substrate and that converts light incident to a first side of the substrate into electric charge;
a cathode region disposed at a second side of the substrate, the second side being opposite the first side;

an anode region disposed at the second side of the substrate;
a first region of a first conductivity type disposed in the substrate;
a second region of a second conductivity type disposed in the substrate, the second conductivity type being different than the first conductivity type; and
at least one trench that penetrates the first region and the cathode region from the second side,
wherein, in a cross-sectional view, the first region and the second region are between the photoelectric conversion region and the second side of the substrate, and
wherein, in the cross-sectional view, an interface between the first region and the second region has an uneven pattern.

(35) The APD sensor of (34), wherein, in the cross sectional view, the uneven pattern is a comb pattern with a plurality of teeth.

(36) The APD sensor of one or more of (34) to (35), wherein, in the cross sectional view, the at least one trench includes a portion that extends into the first region so as to be between neighboring teeth.

(37) The APD sensor of one or more of (34) to (36), wherein the at least one trench includes a plurality of trenches, and wherein, in a plan view, the plurality of trenches form one of a plurality of linear shapes, a plurality of shapes arranged in a matrix, or a mesh shape.

(38) The APD sensor of one or more of (34) to (37), wherein the plurality of trenches include one of an oxide material or a semiconductor material having a different crystal structure than the substrate.

(39) The APD sensor of one or more of (34) to (38), wherein the plurality of trenches include one of an oxide material, a semiconductor material, or a conductive material.

(40) The APD sensor of one or more of (34) to (39), wherein the oxide material includes one of silicon oxide or hafnium oxide, wherein the semiconductor material includes silicon having a different crystal structure than the substrate, and wherein the conductive material includes one of tungsten or copper.

(41) The APD sensor of one or more of (34) to (40), further comprising:
a pixel isolation layer formed in the substrate to isolate the photoelectric conversion region from an adjacent photoelectric conversion region.

(42) An electronic device, comprising:
a controller; and
an avalanche photodiode sensor, including:
a photoelectric conversion region disposed in a substrate and that converts light incident to a first side of the substrate into electric charge;
a cathode region disposed at second side of the substrate, the second side being opposite the first side;
an anode region disposed at the second side of the substrate;
a first region of a first conductivity type disposed in the substrate; and
a second region of a second conductivity type disposed in the substrate, the second conductivity type being different than the first conductivity type,
wherein, in a cross-sectional view, the first region and the second region are between the photoelectric conversion region and the second side of the substrate, and
wherein, in the cross-sectional view, an interface between the first region and the second region has an uneven pattern.

It should be understood by those skilled in the art that various modifications, combinations, sub-combinations and alterations may occur depending on design requirements and other factors insofar as they are within the scope of the appended claims or the equivalents thereof.

REFERENCE SIGNS LIST

100 Distance measurement module
101 Imaging device
110 Light-emitting unit
111 Imaging lens
120 Control unit
121 Image processing unit
130 Imaging control unit
140 Recording unit
200 Solid-state Imaging element
201 Sensor chip
202 Circuit chip
210 Pixel array unit
220 Pixel circuit
221 Resistor
230 Read-out circuit
240, 241, 242 Signal processing unit
250 Anode voltage supply circuit
300 Photodiode
301 Inter-pixel isolation layer
302 Anode
303 Semiconductor substrate
304 n-Layer
305 Trench
306 Cathode
307 p-Layer
308 Amplification region
309 Photoelectric conversion unit
310 Charge storage layer
311 Reflecting plate
312 Light-shielding wall
313 Aperture ratio adjustment metal
314 On-chip lens
12031 Imaging unit

What is claimed is:
1. An avalanche photodiode (APD) sensor comprising:
a photoelectric conversion region disposed in a substrate and that converts light incident to a first side of the substrate into electric charge;
a cathode region disposed at a second side of the substrate, the second side being opposite the first side;
an anode region disposed at the second side of the substrate;
a first region of a first conductivity type disposed in the substrate; and
a second region of a second conductivity type disposed in the substrate, the second conductivity type being different than the first conductivity type, wherein an interface between the first region and the second region forms a p-n junction,
wherein, in a cross-sectional view, the first region and the second region are between the photoelectric conversion region and the second side of the substrate,
wherein, in the cross-sectional view, the interface between the first region and the second region has an uneven pattern,
wherein impurity concentrations of the first region and the second region are greater than an impurity concentration of the substrate having the first conductivity type or the second conductivity type, wherein an entirety of the first region is not exposed at a surface of the substrate at the second side, and wherein, in the cross-sectional view, the uneven pattern is a comb pattern with a plurality of teeth.

2. The APD sensor of claim 1, wherein, in the cross-sectional view, the first region surrounds three sides of the cathode region.

3. The APD sensor of claim 2, wherein, in a plan view, the anode region surrounds the first region, the second region, and the cathode region.

4. The APD sensor of claim 1, further comprising:
at least one trench penetrating the first region and the cathode region from the second side.

5. The APD sensor of claim 4, wherein the at least one trench includes one of an oxide material or a semiconductor material having a different crystal structure than the substrate.

6. The APD sensor of claim 5, wherein the at least one trench is filled with one of the oxide material or the semiconductor material having the different crystal structure than the substrate.

7. The APD sensor of claim 4, wherein the at least one trench includes one of an oxide material, a semiconductor material, or a conductive material.

8. The APD sensor of claim 7, wherein the at least one trench is filled with one of the oxide material, the semiconductor material, or the conductive material.

9. The APD sensor of claim 7, wherein the oxide material includes one of silicon oxide or hafnium oxide, wherein the semiconductor material includes silicon having a different crystal structure than the substrate, and wherein the conductive material includes one of tungsten or copper.

10. The APD sensor of claim 4, wherein the at least one trench includes a plurality of trenches, and wherein, in a plan view, the plurality of trenches form one of a plurality of linear shapes, a plurality of shapes arranged in a matrix, or a mesh shape.

11. The APD sensor of claim 10, wherein, in the cross sectional view, at least one of the plurality of trenches includes a portion that extends into the first region so as to be between sections of the uneven pattern of the interface.

12. The APD sensor of claim 1, further comprising:
a pixel isolation layer formed in the substrate to isolate the photoelectric conversion region from an adjacent photoelectric conversion region.

13. The APD sensor of claim 1, wherein the first region and the second region with the uneven pattern amplify the electric charge converted by the photoelectric conversion region.

14. An avalanche photodiode sensor (APD) sensor, comprising:

a photoelectric conversion region disposed in a substrate and that converts light incident to a first surface of the substrate into electric charge;

a cathode region disposed in a second surface of the substrate, the second surface being opposite the first surface;

an anode region disposed in the second surface of the substrate;

a first region of a first conductivity type disposed in the substrate;

a second region of a second conductivity type disposed in the substrate, the second conductivity type being different than the first conductivity type, wherein an interface between the first region and the second region forms a p-n junction; and at least one trench that penetrates the first region and the cathode region from the second surface, wherein an entirety of the first region is not exposed at the second surface of the substrate, wherein, in a cross-sectional view, the first region and the second region are between the photoelectric conversion region and the second surface of the substrate, wherein, in the cross-sectional view, the interface between the first region and the second region has an uneven pattern, and wherein, in the cross-sectional view, the uneven pattern is a comb pattern with a plurality of teeth.

15. The APD sensor of claim 14, wherein, in the cross-sectional view, the at least one trench includes a portion that extends into the first region so as to be between neighboring teeth.

16. The APD sensor of claim 15, wherein the at least one trench includes a plurality of trenches, and wherein, in a plan view, the plurality of trenches form one of a plurality of linear shapes, a plurality of shapes arranged in a matrix, or a mesh shape.

17. The APD sensor of claim 16, wherein the plurality of trenches include one of an oxide material or a semiconductor material having a different crystal structure than the substrate.

18. The APD sensor of claim 16, wherein the plurality of trenches include one of an oxide material, a semiconductor material, or a conductive material.

19. The APD sensor of claim 18, wherein the oxide material includes one of silicon oxide or hafnium oxide, wherein the semiconductor material includes silicon having a different crystal structure than the substrate, and wherein the conductive material includes one of tungsten or copper.

20. The APD sensor of claim 15, further comprising:
a pixel isolation layer formed in the substrate to isolate the photoelectric conversion region from an adjacent photoelectric conversion region.

* * * * *